(12) United States Patent
Kono et al.

(10) Patent No.: US 6,489,819 B1
(45) Date of Patent: Dec. 3, 2002

(54) CLOCK SYNCHRONOUS SEMICONDUCTOR MEMORY DEVICE ALLOWING TESTING BY LOW SPEED TESTER

(75) Inventors: Takashi Kono, Hyogo (JP); Takeshi Hamamoto, Hyogo (JP); Yasuhiro Konishi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 40 days.

(21) Appl. No.: 09/179,411

(22) Filed: Oct. 27, 1998

(51) Int. Cl.[7] .................................................. G11C 7/00
(52) U.S. Cl. ........................ 327/141; 365/201; 365/233
(58) Field of Search .................................. 327/141, 164, 327/163, 261, 170, 165; 365/201, 233

(56) References Cited

U.S. PATENT DOCUMENTS

| | | | |
|---|---|---|---|
| 5,208,838 A | 5/1993 | Wendell et al. | 327/114 |
| 5,300,832 A | 4/1994 | Rogers | 326/57 |
| 5,378,943 A | 1/1995 | Dennard | 327/530 |
| 5,453,993 A * | 9/1995 | Kitaguchi et al. | 324/73.1 |
| 5,550,500 A * | 8/1996 | Stephens, Jr. et al. | 327/261 |
| 5,640,509 A | 6/1997 | Balmer et al. | 395/183.18 X |
| 5,717,652 A | 2/1998 | Ooishi | 365/201 |
| 5,745,430 A | 4/1998 | Wong et al. | 365/201 |
| 5,757,705 A * | 5/1998 | Manning | 327/201 |
| 5,870,342 A * | 2/1999 | Fukuda | 365/189.05 |
| 5,933,379 A * | 8/1999 | Park et al. | 327/201 |

FOREIGN PATENT DOCUMENTS

| | | |
|---|---|---|
| JP | 62-159244 | 7/1987 |
| JP | 3-91195 | 4/1991 |
| JP | 4-227312 | 8/1992 |
| JP | 5-288805 | 11/1993 |
| JP | 6-242188 | 9/1994 |
| JP | 7-78498 | 3/1995 |
| JP | 8-83498 | 3/1996 |
| JP | 8-271593 | 10/1996 |
| JP | 9-7396 | 1/1997 |
| JP | 9-243713 | 9/1997 |

OTHER PUBLICATIONS

"Circuit Techniques for 1.5—3.6–V Battery–Operated 64–Mb DRAM," by Yoshinobu Nakagome et al., vol. 26, No. 7, Jul. 1991 IEEE.

* cited by examiner

Primary Examiner—Dinh T. Le
(74) Attorney, Agent, or Firm—McDermott, Will & Emery

(57) ABSTRACT

Pulses are generated using an edge of a clock signal applied from a low speed tester as a trigger, and internal clock signals are generated utilizing the pulses. Internal circuitry is operated in synchronization with the internal clock signals. Thus a synchronous semiconductor device operating at high speed can be tested using a low speed tester.

16 Claims, 19 Drawing Sheets

(BEFORE PACKAGING)

L1=L2

L3=L4 ts IS CONTROLLABLE
BY CHANGING DUTY (tch/tcl)

CLOCK SYNCHRONOUS SEMICONDUCTOR MEMORY DEVICE ALLOWING TESTING BY LOW SPEED TESTER

BACKGROUND OF THE INVENTION

1. Field of the Invention

The present invention relates to a semiconductor device operating in synchronization with a clock signal and, more specifically, to a clock synchronous semiconductor memory device of which timing margin can be tested by using a clock signal at a lower speed than the clock signal in normal operation mode.

2. Description of the Background Art

In recent years, operation frequency of a microprocessor (MPU) has been improved remarkably. By contrast, improvement in operation frequency of a memory, in particular, of a dynamic random access memory (DRAM) used as a main storage is relatively modest. This results in increased difference in speed of operation between MPU and DRAM, so that data transfer rate between the MPU and the main storage (DRAM) comes to be determined by the speed of operation of the DRAM, hindering high speed data transfer between the MPU and the main storage. Namely, the speed of operation of the DRAM has been a bottleneck against improved performance of the overall system.

Conventionally, in the DRAM, high speed data transfer has been implemented by a high speed operation mode such as a fast page mode or an EDO (Extended Data Output) mode, while band width of data transfer is increased by adopting wide word configuration of ×16 bits, for example, to improve data transfer rate.

However, even if the high speed operation mode is employed, the operation frequency itself is about 66 MHz which is much lower than that of the MPU. Therefore, the conventional DRAM does not have sufficiently high operation frequency to be used as the main storage for the MPU having operation frequency of 100 MHz or 200 MHz. When word configuration is simply widened, the number of data input/output pins increases and package size increases, so that it becomes difficult to provide a small size system and package cost increases.

In order to realize higher data transfer rate, clock synchronous memories operating in synchronization with a clock signal, such as a synchronous DRAM (SDRAM), a DDR (Double Data Rate) DRAM and a Sync Link DRAM (SLDRAM) have been developed as DRAMs having higher operation frequency.

FIG. 1 is a timing chart representing operation of a conventional SDRAM. Referring to FIG. 1, waveforms of external signals to an SDRAM having 4 bank configuration and inputting/outputting 16 bits of data DQ0 to DQ15 at the time of data writing are depicted as an example. Among 4 banks, one bank is designated by bank address signal bits BA0 and BA1. Address signal bits A0 to A11 are used as a row address signal (X), and address signal bits A0 to A9 are used as a column address signal (Y). Address signal bit A10 is utilized as a command instructing auto precharge for automatically returning the inside to precharge state after completion of write/read operation, when a command instructing data write or read is applied. Operation of the SDRAM will be described with reference to FIG. 1

In cycle #1 of the clock signal CLK, a chip select signal/CS and a row address strobe signal /RAS are set to the L level, and a column address strobe signal /CAS and a write enable signal /WE are set to the H level. The combination of the states of these external control signals is referred to as an active command ACT, and array activation is designated thereby. When the active command ACT is applied, address signal bits A0 to A11 applied at that time are used as the row address signal (X), and row selecting operation takes place in the bank that is designated by bank address signal bits BA0 and BA1. Referring to FIG. 1, row selecting operation takes place in bank 0. By the row selecting operation, the addressed row (word line) is driven to a selected state, and data of memory cells connected to the selected word line are amplified and latched by a sense amplifier.

When chip select signal /CS is at the H level at a rising edge of clock signal CLK, every command is treated as an NOP command, and a new operation mode is not designated. When clock enable signal CKE is at the H level, an internal clock signal is generated in accordance with an external clock signal, and internal circuitry operates. When the clock enable signal CKE is set to the L level, generation of the internal clock signal in the next cycle is stopped, and the internal circuitry holds the state of that cycle in the next cycle.

In clock cycle #4, at a rising edge of clock signal CLK, chip select signal /CS, column address strobe signal /CAS and write enable signal (VWE are set to the L level, and row address strobe signal /RAS is set to the H level. The combination of the states of the control signals at this time is referred to as a write command WRITE instructing data writing, and column selecting operation and writing of data to the memory cells on the selected columns are performed. When the write command WRITE is applied, address signal bits A0 to A9 applied at that time are used as the column address signal (Y), and column selecting operation takes place. By bank address signal bits BA0 and BA1, the bank in which column selection is to be done is designated (in the example of FIG. 1, bank 0 is designated).

In data writing, when a data mask designating signal DQMU/L is at the L level, data D0 applied in clock cycle #4 is taken and an internal write data is generated. When the write command is applied, using a column address signal applied simultaneously with the write command as a leading address, column addresses are internally generated in a prescribed sequence, and column selection operation is performed. In clock cycles #5, #6 and #7, data D1, D2 and D3 are taken respectively, internal write data are generated based on the taken data, and written to the selected memory cells in a prescribed sequence.

When data mask designating signal DQMU/L is set to the H level, data writing is masked, and data writing does not take place. The data mask designating signal DQMU/L is a signal of 2 bits, which can mask data writing byte by byte. As address signal bit A10 is at the L level when the write command is applied, auto precharge operation is not performed. In the auto precharge operation, precharging operation is automatically done internally (the selected array is driven to the inactive state) at the completion of writing or reading of data of burst length.

In clock cycle #8, at the rising edge of clock signal CLK, chip select signal /CS, row address strobe signal /RAS and write enable signal /WE are set to the L level, and the column address strobe signal /CAS is set to the H level. At this time, address signal bit A10 is set to the L level, and bank 0 is designated by the bank address signal bits BA0 and BA1. The combination of the states of the external control signals is referred to as a precharge command PRE, and the designated bank is driven to the inactive state (the selected word line is driven to the non-selected state).

In clock cycle #11, the active command ACT is again applied to bank 0, and row selecting operation takes place in bank 0.

In data reading, a read command is applied in place of a write command. The read command is applied by setting, at the rising edge of clock signal CLK, chip select signal /CS and column address strobe signal /CAS to the L level and row address strobe signal /RAS and write enable signal /WE to the H level. At the time of data reading, generally, data is externally output after the lapse of a period referred to as CAS latency, after application of the read command. The read data attains to a definite state at the rising edge of clock signal CLK.

As can be seen from FIG. 1, as the external control signals are taken at the rising edge of clock signal CLK, what is required is to consider skew of each of the external control signals and the address signals with respect to the clock signal CLK, and it is unnecessary to take skew between control signals into consideration. This allows reduced timing margin, and therefore internal operation can be started at a fast timing. Further, as the data is input/output in synchronization with clock signal CLK, data transfer rate is determined by the operation frequency of clock signal CLK, and therefore high speed data transfer is realized.

When the DRAM operating at high speed in synchronization with the clock signal as described above is to be tested before shipment, a series of timing tests referred to as margin test are conducted. In the margin test, whether a chip under test satisfies timing condition defined by product specification or not is determined. For example, referring to FIG. 1, whether a time period tRCD (RAS-CAS delay time) between the active command ACT and a write command WRITE (or read command), a time period tWR (write recovery time) after input of last data until application of precharge command PRE, and a time period tRP (RAS precharge time) after application of precharge command PRE until application of the next active command ACT satisfy values defined by the specification are determined. In the synchronous memory, these time periods are measured using the cycle of the clock signal CLK as a unit. Therefore, a tester used for testing such a timing margin must have testable frequency which is at least the highest operation frequency of the chip to be tested.

It is difficult for a tester introduced in order to test fast page mode and EDO mode operations of the conventional DRAM to test the SDRAM and the like operated at high speed. When a low speed tester having the speed of operation of about 33 MHz is used, the minimum clock cycle is 33 ns. As the timing margin is measured using the clock cycle as a reference, only a timing margin of 33 ns at the smallest can be measured. Timing generation at a shorter time interval than the minimum clock cycle and hence measurement thereof are not possible.

A possible approach is to generate a clock signal of a multiple frequency on the tester side to conduct the test. However, the tester itself cannot operate in accordance with the clock signal of such multiple frequency. Therefore, there arises another problem that exact setting of timings in accordance with a test program is difficult.

The problem in testing can be solved by introducing a new tester dedicated for products which operate at high speed. This approach, however, involves new investment, and a low speed tester which is a past resource would be wasted. It should be noted that the DRAM operating in synchronization with the clock signal has the same internal configuration as the conventional DRAM having the high speed access mode (fast page mode and EDO mode) (only difference is that the data write/read circuit operates in synchronization with the clock signal), and therefore the same program may be used as the test program.

SUMMARY OF THE INVENTION

An object of the present invention is to provide a clock synchronous semiconductor device which allows desired test exactly even by a tester which in turn operates at a low speed.

Another object of the present invention is to provide a clock synchronous semiconductor memory device which allows testing of timing margin exactly, even when a clock signal slower than the clock signal applied in the normal operation mode is used.

In summary, in the present invention, a transition of a clock signal applied through a specific pad is used as a trigger to generate pulses, and the pulses are used as internal clock signals.

The transition used as the trigger is transition of a plurality of clock signals in same direction, or transitions of one clock signal in different directions.

As the pulses are generated using a transition of the clock signal as a trigger, internal clock signals having higher frequency than the original clock signal can be generated, and therefore even when a low speed clock signal is used, the semiconductor device can be operated at high speed in accordance with the pulses.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
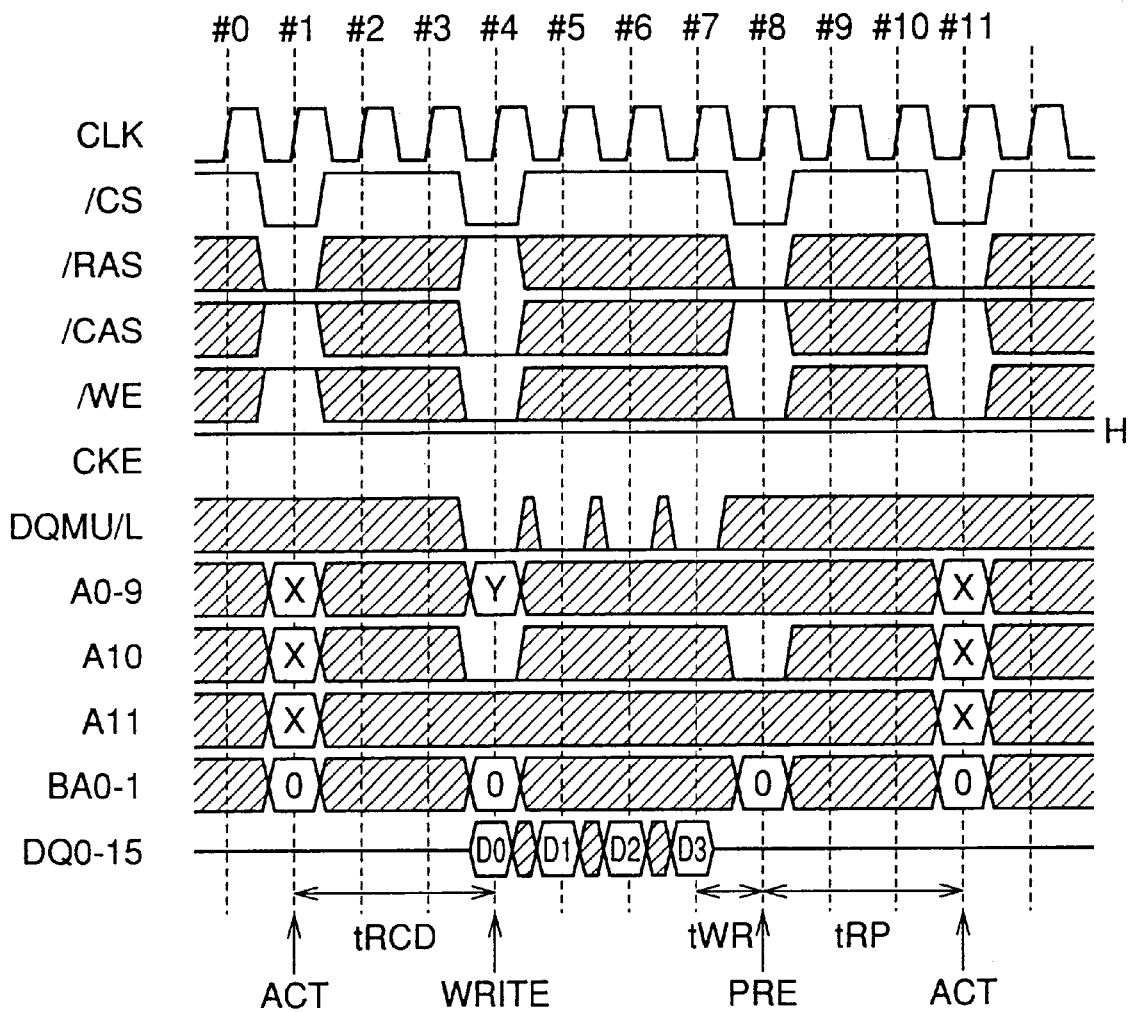
FIG. 1 is a timing chart representing operation of a conventional synchronous semiconductor memory device.
Figure 2:
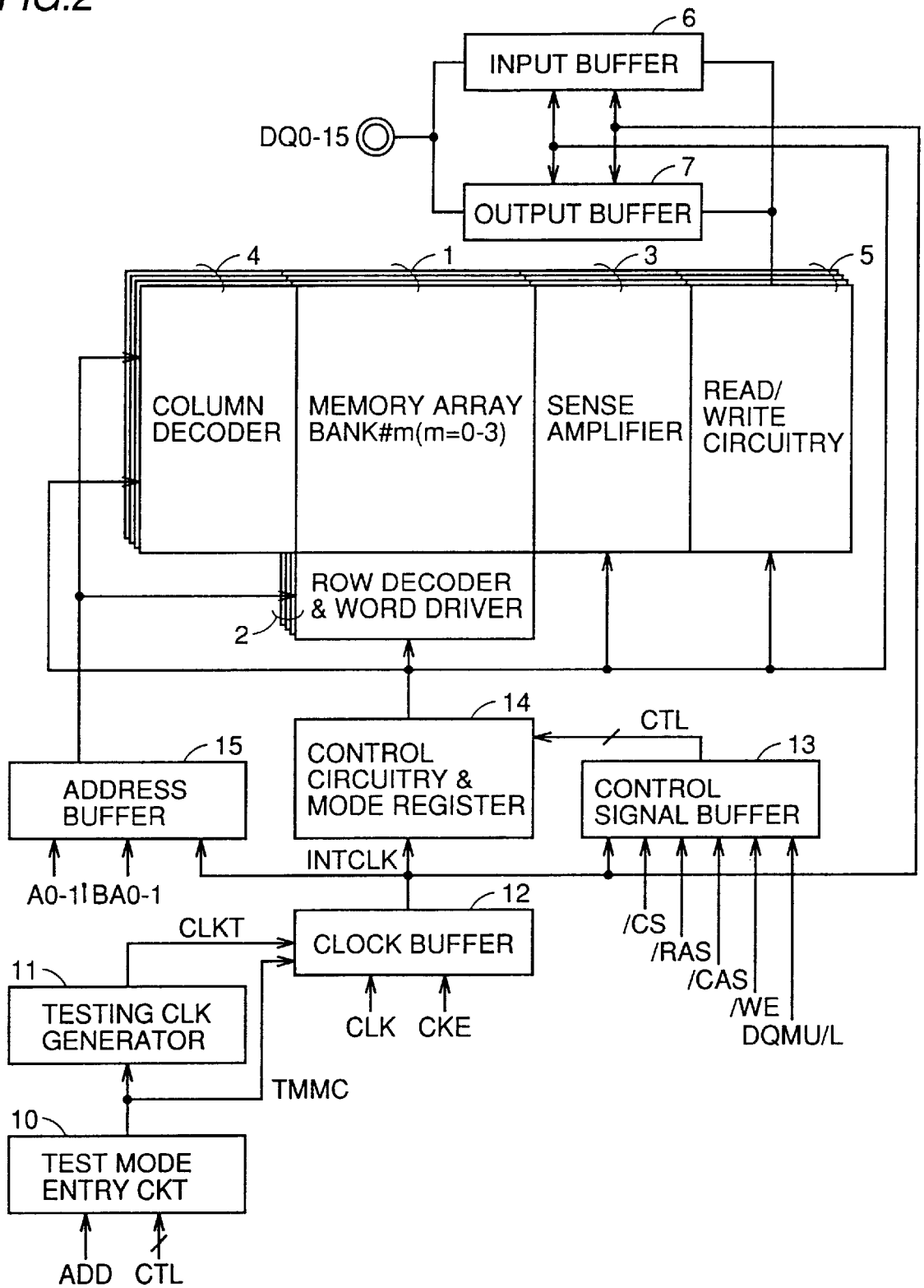
FIG. 2 schematically shows overall configuration of the synchronous semiconductor memory device in accordance with the present invention.

FIG. 2 schematically represents overall configuration. of the synchronous semiconductor memory device in accordance with the present invention. In FIG. 2, a synchronous DRAM operating in synchronization with an externally applied clock signal CLK in a normal operation mode is depicted as an example of a synchronous semiconductor memory device.

Referring to FIG. 2, the synchronous DRAM (SDRAM) in accordance with the present invention includes a memory array 1 having a plurality of memory cells arranged in a matrix of rows and columns, a row decoder /word driver 2 driving an addressed row to a selected state, sense amplifiers 3 provided corresponding to respective columns of memory array 1 for sensing, amplifying and latching memory cell data on the selected row, a column decoder 4 for selecting an address designated column, and a read/write circuit 5 for reading/writing data from to the memory cells on the column selected by the column decoder 4.

Memory array 1 includes four banks #0 to #3. In memory array 1, word lines are arranged corresponding to respective rows of the memory cells, and bit line pairs are arranged corresponding to respective columns of the memory cells. Row decoder/word driver 2 is arranged corresponding to each of the banks #0 to #3, and drives the word line arranged corresponding to the addressed row in a designated bank to the selected state. Sense amplifier 3 and column decoder 4 are also arranged corresponding to each of the banks #0 to #3, and the sense amplifier and the column decoder that are provided corresponding to the designated bank are activated. Similarly, read/write circuit 5 is provided corresponding to each of the banks #0 to #3.

SDRAM further includes an input buffer 6 coupled to read/write circuit 5 for generating internal write data from externally applied write data DQ0 to DQ15 and applying the generated data to read/write circuit 5, and an output buffer 7 coupled to read/write circuit 5 for externally outputting data read from read/write circuit 5. Input buffer 6 and output buffer 7 input/output data in synchronization with an internal clock signal INTCLK, which will be described later. Input buffer 6 and output buffer 7 are coupled to read/write circuit 5, and input/output data to a selected bank through the read/write circuit provided for the designated bank.

The SDRAM further includes a test mode entry circuit 10 for determining whether a test mode is designated or not in accordance with a specific address signal bit ADD and internal control signals CTL (a plurality of control signals), a testing CLK generator 11 activated in response to a test mode designating signal TMMC from test mode entry circuit 10, for generating, based on a clock signal applied externally, a test clock signal CLKT having higher frequency than the external clock signal when activated, a clock buffer 12 receiving the external clock signal CLK, a clock enable signal CKE and the test clock signal CLKT, responsive to the test mode designating signal TMMC for generating an internal clock signal INTCLK corresponding to either of the test clock signal CLKT or the external clock signal CLK, a control signal buffer 13 taking in external signals /CS, /RAS, /CAS, /WE and DQMU/L in synchronization with internal clock signal INTCLK from clock buffer 12 for generating the internal control signals CTL, and control circuit 14 taking the internal control signals CTL from control signal buffer 13 in synchronization with internal clock signal INTCLK from clock buffer 12 for generating various internal control signals for performing a designated operation mode.

Control circuit 14 includes a mode register storing data for designating burst length, CAS latency, data output mode and so on. Control circuit 14 generates necessary internal control signals at a prescribed timing in accordance with the data designating an operation mode stored in the mode register, and applies the generated internal control signals to row decoder/word driver 2, sense amplifier 3, column decoder 4, read/write circuit 5, input buffer 6 and output buffer 7.

The SDRAM further includes an address buffer 15 taking externally applied address signal bits A0 to A11 and bank address signal bits BA0 and BA1 in synchronization with internal clock signal INTCLK from clock buffer 12 and generating an internal address signal. The internal address signal from address buffer 15 is applied to row decoder/word driver 2 and column decoder 4. In that bank designated by bank address signal bits BA0 and BA1, row selection and column selection, as well as data writing/reading operation are performed.

In the SDRAM shown in FIG. 2, in a test operation mode, test mode designating signal TMMC is activated, test clock signal CLKT is generated by testing CLK generating circuit 11, and internal clock signal INTCLK corresponding to test clock signal CLKT is generated by clock buffer 12. Testing CLK generator 11, of which configuration will be described in greater detail later, makes frequency of test clock signal CLKT higher than the externally applied clock signal CLK applied in the normal operation mode. Testing CLK generator 11 generates pulses using an edge of a clock signal applied externally in the test mode (the test clock or an external clock signal CLK applied through a specific pad) as a trigger. As a result, even when a low speed clock signal is applied in the test operation mode, high speed internal clock signal INTCLK can be generated, and hence the internal circuitry can be operated at high speed.

Specific configuration of test CLK generating circuit 11 and clock buffer 12 shown in FIG. 2 will be described in the following.

Clock Generating Circuitry Configuration 1

Figure 3:
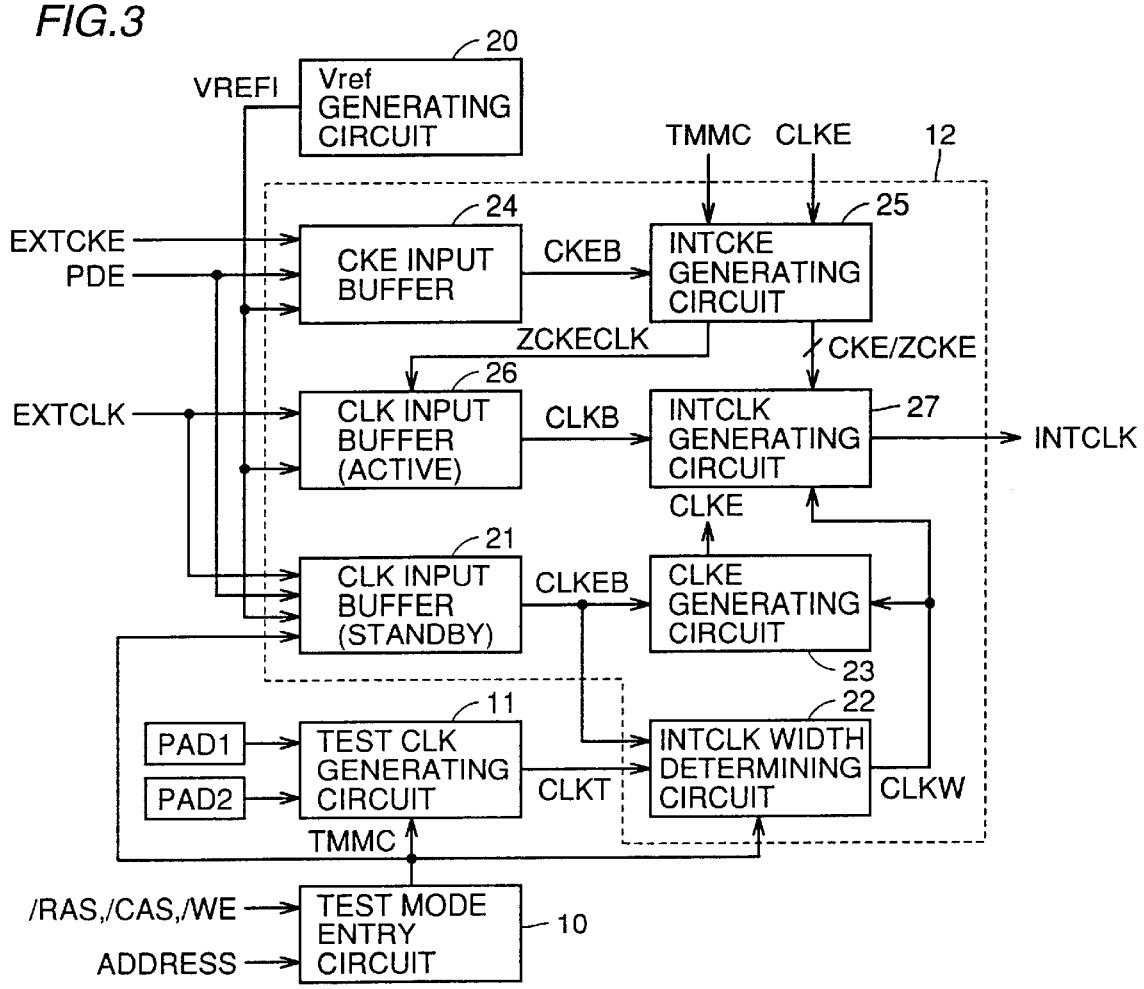
FIG. 3 is a diagram representing configuration of a clock buffer and a testing CLK generating circuit shown in FIG. 2.

FIG. 3 schematically represents configuration of the internal clock generating circuitry in accordance with the first embodiment of the present invention. In FIG. 3, test mode entry circuit 10, testing CLK generating circuit 11 and an internal configuration of clock buffer 12 of FIG. 2 are depicted.

Referring to FIG. 3, clock buffer 12 includes a standby CLK input buffer 21 receiving test mode designating signal TMMC from test mode entry circuit 10, a reference voltage VREF from a Vref generating circuit 20, an external clock signal EXTCLK and a power down enable signal PDE for generating an internal timing signal CLKEB synchronized with external clock signal EXTCLK in the normal operation mode, and an internal clock signal (INTCLK) width determining circuit 22 receiving the timing signal CLKEB from standby CLK input buffer 21, test clock signal CLKT from test CLK generating circuit 11 and test mode designating signal TMMC from test mode entry circuit 10 for generating a timing signal CLKW for determining a width of the internal clock signal INTCLK. When test mode designating signal TMMC is activated or power down enable signal PDE is activated, standby CLK input buffer 21 fixes the timing signal CLKEB output therefrom at a prescribed voltage level (H level). Internal clock signal width determining circuit 22 generates, in the normal operation mode, the timing signal CLKW having a constant pulse width in synchronization with the timing signal CLKEB, and generates, in the test operation mode, the timing signal CLKW in synchronization with the test clock signal CLKT from testing CLK generating circuit 11.

Clock input buffer 12 further includes a CLKE generating circuit 23 receiving timing signal CLKW from internal clock signal width determining circuit 22 and timing signal CLKEB from standby CLK input buffer 21 for generating a transfer designating signal CLKE, a CKE input buffer 24 activated when power down enable signal PDE is inactivated, for generating a clock enable signal CKEB in accordance with a result of comparison between external clock enable signal EXTCKE and reference voltage Vref1 from reference voltage generating circuit (Vref generator) 20, an INTCKE generating circuit 25 for transferring clock enable signal CKEB from CKE input buffer 24 in synchronization with timing signal CLKE for generating internal clock control signals CKE, ZCKE and ZCKECLK when test mode designating signal TMMC is inactivated, an active CLK input buffer 26 activated when control signal ZCKECLK from INTCKE generating circuit 25 is active (L level), comparing external clock signal EXTCLK with reference voltage VREF1, for generating, based on the result of comparison, clock signal CLKB, and an INTCLK generating circuit 27 for generating, in accordance with clock signal CLKB from active CLK input buffer 26, timing signal CLKW from internal clock signal width determining circuit 22 and control signal ZCKE from INTCKE generating circuit 25, an internal clock signal INTCLK having a prescribed time width in synchronization with clock signal CLKB in the normal operation mode.

In the normal operation mode, INTCKE generating circuit 25 transfers clock enable signal CKEB from CKE input buffer 24 in synchronization with transfer designating signal CLKE from CLKE generating circuit 23, and generates control signals ZCKECLK, CKE and ZCKE. In the normal operation mode, INTCLK generating circuit 27 determines pulse width of internal clock signal INTCLK in accordance with control signal CLKW from INTCLK width determining circuit 22, and generates internal clock signal INTCLK having constant pulse width and synchronized with clock signal CLKB from CLK input buffer 26.

Reference voltage VREF1 from reference voltage (Vref) generating circuit 20 is used in CKE input buffer 24, active CLK input buffer 26 and standby CLK input buffer 21, for determining H and L levels of external clock enable signal EXTCKE and external clock signal EXTCLK.

Testing clock (CLK) generating circuit 11 generates test clock signal CLKT in synchronization with two phase clock signals applied from the tester through two pads PAD 1 and PAD 2. Testing clock generating circuit 11 generates test clock signal CLKT using edges of clock signals applied to pads PAD 1 and PAD 2 as a trigger. Therefore, even when the clock signals applied to pads PAD 1 and PAD 2 are at low speed, the frequency of test clock CLKT can be made higher than the frequency of the clock signals applied to pads PAD 1 and PAD 2.

In the test operation mode, internal clock signal width determining circuit 22 generates control signal CLKW which is in synchronization with test clock signal CLKT. Therefore, internal clock (INTCLK) generating circuit 27 generates internal clock signal INTCLK which is in synchronization with test clock signal CLKT, through the control signal CLKW. Operation of the clock generating circuitry shown in FIG. 3 will be described with reference to FIG. 4.

Clock signals having the same cycle period and different phases are applied to pads PAD 1 and PAD 2. Generally, in the tester, a base clock signal and a clock signal obtained by delaying the base clock signal are generated. Using the delayed clock signal, the tester generates a pulse signal having a prescribed pulse width and a data strobe timing, in accordance with a test program. The clock signals of different phases are utilized for measuring setup time TSU and hold time THD relative to row address strobe signal /RAS in the conventional DRAM. In the first embodiment of the present invention, the function of generating clock signals of different phases provided in a common tester is utilized. Phase difference (delay time) ts of the clock signals applied to pads PAD 1 and PAD 2 can be made as small as a few nanoseconds (ns). Generally, the cycle period of a high speed external clock signal EXTCLK is about 7 to 10 ns, and therefore skew of the clock signals applied to pads PAD 1 and PAD 2 may be set to a value comparable to or shorter than the period of the high speed external clock signal EXTCLK.

Testing CLK generating circuit 11 generates a pulse signal having a prescribed time width in response to the rise of the clock signal applied to each of the pads PAD 1 and PAD 2, and outputs the pulse signal as test clock signal CLKT. In the test mode, in accordance with the test clock CLKT, internal clock signal INTCLK is generated by INTCLK width determining circuit 22 and INTCLK generating circuit 27. Therefore, in the test operation mode, internal clock signal INTCLK is the clock signal having, as its cycle period, skew between clocks at pads PAD 1 and PAD 2.

The tester sets states of external control signals in accordance with the clock signals applied to pads PAD 1 and PAD 2. At time ta, in response to the rise of the clock signal applied to pad PAD 1, internal clock signal INTCLK having a prescribed time width is generated. At this time, chip select signal /CS and row address strobe signal /RAS are set to the L level and column address strobe signal /CAS and write enable signal /WE are set to the H level (in FIG. 4, address signal bits A0 to A11 are not shown). This state corresponds to the active command ACT, and row selecting operation is designated.

At time tb, in response to the rise of the clock signal applied to pad PAD 2, internal clock signal INTCLK is generated. At time tb, chip select signal CS, column address strobe signal /CAS and write enable signal /WE are set to the L level, and row address strobe signal /RAS is set to the H level. This state corresponds to the write command WRITE instructing data writing, and data applied at this time is written.

At time tc, when the clock signal to pad PAD 1 rises, internal clock signal INTCLK rises to the H level. At this time point tc, chip select signal /CS, row address strobe signal /RAS and write enable signal /WE are set to the L level, so as to apply the precharge command PRE. Consequently, the internal selected array is returned to the precharged state.

At time td, when the clock signal applied to pad PAD 2 rises, internal clock signal INTCLK again rises to the H level. At this time, chip select signal /CS and row address strobe signal /RAS are set to the L level, and column address strobe signal /CAS and write enable signal /WE are set to the H level, so as to apply the active command ACT.

The time period between time points tb and ta corresponds to RASCAS delay time tRCD, the time period between time points tb and tc corresponds to write recovery time tWR, and time period between time points td and tc corresponds to RAS precharge time tRP. Therefore, by setting phase difference of clock signals applied to pads PAD1 and PAD2 to an appropriate time period, the internal circuitry may operate at the interval of the time period ts as the minimum interval, and hence the SDRAM can be operated at high speed using a low speed clock signal.

The tester operates at the cycles of the clock signals applied to pads PAD 1 and PAD2. Therefore, the cycles of external control signals /CS, /RAS, /CAS and /WE cannot be made shorter than the cycle of the clock signals applied to pads PAD1 and PAD2. Here, referring to FIG. 4, even when the cycle of the external control signals are made longer, by causing transitions of the signals between the rising edges of clock signals applied to pads PAD1 and PAD2, different commands can surely be applied at successive rising edges of test clock signal CLK. As to a control signal of which logic differs at successive rising edges of test clock signal CLKT, the control signal is adapted such that the state thereof changes in response to the rise of the clock signal applied to pad PAD1.

Figure 4:
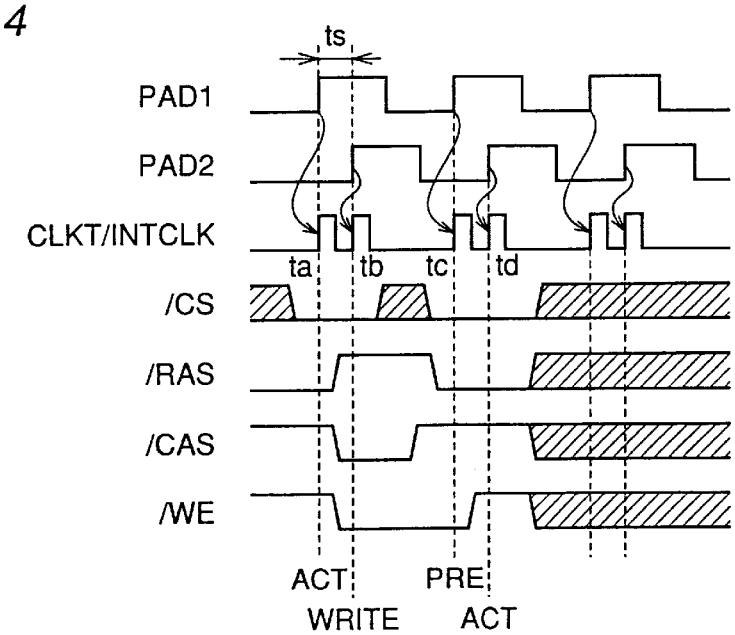
FIG. 4 is a diagram of signal waveforms representing operation of the circuits of FIG. 3.

Control signal buffer 13 shown in FIG. 4 is set to the latching state in synchronization with the rise of internal clock signal INTCLK. Therefore, even when the states of external control signals are changed in response to the rise of internal clock signal INTCLK (test clock signal CLKT), there is no adverse influence on the operation of the internal circuitry. In an SDRAM operating at high speed, for example, in an SDRAM operating at 100 MHz, the cycle period of external clock signal EXTCLK is 10 ns and set up/hold time is several nano seconds (ns). The set up/hold time of the high speed SDRAM is comparable to the skew between clocks from the low speed tester. Therefore, it is possible to cause transition of the states of external control signals using the low speed tester such that even when the states of the external control signals are changed within the skew between clock signals applied to pads PAD1 and PAD2, the set up/hold time of these external control signals can be ensured. Specific configurations of respective portions will be described in the following.

Figure 5:
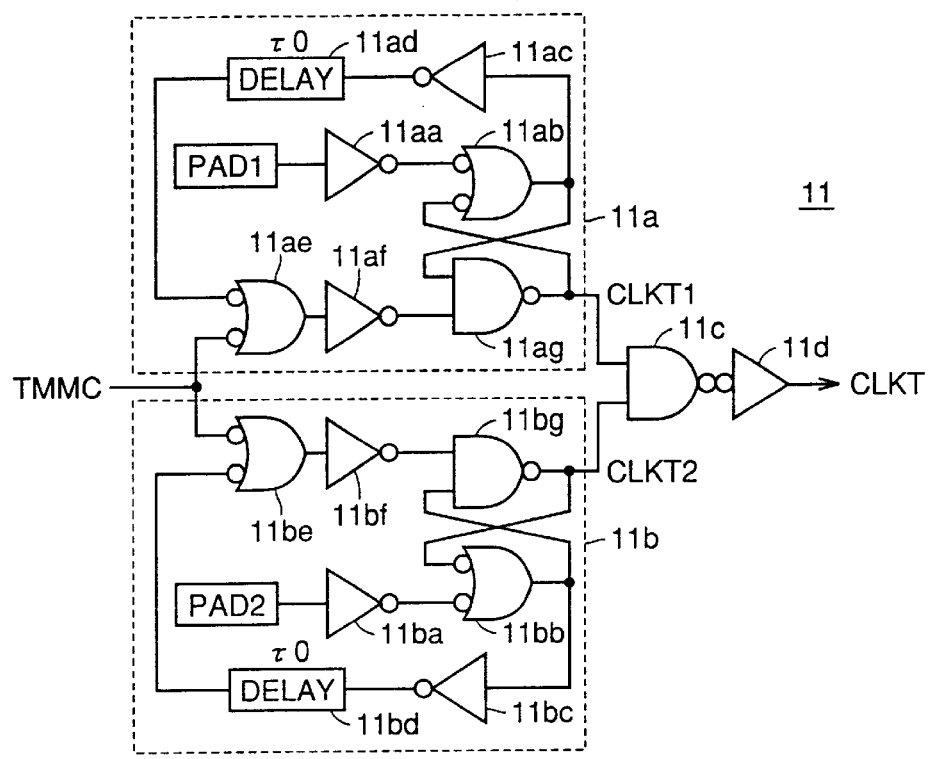
FIG. 5 is a diagram representing configuration of the testing CLK generating circuit of FIG. 3.

FIG. 5 shows the configuration of testing CLK generating circuit 11 of FIG. 3. Referring to FIG. 5, testing CLK generating circuit 11 includes a first pulse generating circuit 11a for generating a pulse signal CLKT1 having a prescribed time width in response to the clock signal applied to pad PAD1, a second pulse generating circuit 11b for generating a pulse signal CLKT2 having a prescribed time width in response to the clock signal applied to pad PAD2, an NAND circuit 11c receiving these pulse signals CLKT1 and CLKT2, and an inverter 11d outputting test clock signal CLKT by inverting an output signal from NAND circuit 11c.

First pulse generating circuit 11a includes an inverter 11aa receiving the clock signal applied to pad PAD1, an NAND circuit 11ab receiving at a first input an output signal from inverter 11aa, an inverter 11ac inverting an output of NAND circuit 11ab, a delay circuit 11ad for delaying by a prescribed time τ0 an output signal from inverter 11ac, an NAND circuit 11ae receiving test mode designating signal TMMC from test mode entry circuit 10 shown in FIG. 3, and an output signal from delay circuit 11ad, an inverter 11af inverting an output signal from NAND circuit 11ae, and an NAND circuit 11ag receiving an output signal from NAND circuit 11ab and an output signal from inverter 11af for generating pulse signal CLKT1. Pulse signal CLKT1 from NAND circuit 11ag is applied to a second input of NAND circuit 11ab.

Second pulse generating circuit 11b includes an inverter 11ba inverting the clock signal applied to pad PAD2, an NAND circuit 11bb receiving an output signal from inverter 11ba and pulse signal CLKT2, an inverter 11bc inverting an output signal from NAND circuit 11bb, a delay circuit 11bd delaying by a prescribed time τ0 an output signal from inverter 11bc, an NAND circuit 11be receiving an output signal from delay circuit 11bd and test mode designating signal TMMC, an inverter 11bf inverting an output signal from NAND circuit 11be, and an NAND circuit 11bg receiving an output signal from inverter 11bf and an output signal from NAND circuit 11bb for outputting pulse signal CLKT2. NAND circuits 11ab and 11ag constitute a set/reset flip-flop, and NAND circuits 11bg and 11bb constitute a set/reset flip-flop. Operation of the testing CLK generating circuit shown in FIG. 5 will be described with reference to the diagram of signal waveforms shown in FIG. 6.

When test mode designating signal TMMC is in the inactive state of L level, output signals from NAND circuits 11ae and 11be are both at the H level, and in response, output signals from inverters 11af and 11bf attain the L level, and pulse signals CLKT1 and CLKT2 are fixed at the H level. Accordingly, test clock signal CLKT is also fixed at the H level.

In the test operation mode, test mode designating signal TMMC is set to the H level, and NAND circuits 11ae and 11be operate as an inverter. When the clock signal applied to pad PAD1 rises to the H level, the output signal from inverter 11aa attains to the L level and, in response, the output signal from NAND circuit 11ab rises to the H level. When the output signal from NAND circuit 11ab rises to the H level, after the lapse of time τ0, the output signal from delay circuit 11ad falls to the L level, and in response, the output signal from inverter 11af also falls to the L level. When the output signal of delay circuit 11ad is at the H level, that is, when the output signal of inverter 11af is at the H level, and when the output signal from NAND circuit 11ab rises to the H level, then pulse signal CLKT1 from NAND circuit 11ad falls to the L level. Pulse signal CLKT1 from NAND circuit 11ag rises to the H level when the output signal from inverter 11af falls to the L level. Therefore, pulse signal CLKT1 attains to the L level in response to the rise of the clock signal applied to pad PAD1, and kept at the L level for the delay time τ0 required by the delay circuit 11ab.

When the clock signal applied to pad PAD1 falls to the L level, pulse signal CLKT1 attains to the H level, and the output signal from NAND circuit 11ab falls to the L level. Accordingly, the set/reset flip-flop constituted by NAND circuits 11ab and 11ag is set in response to the rise of the clock signal applied to pad PAD1 and reset in response to the fall of the output signal from delay circuit 11ad.

The second pulse generating circuit 11b operates in the similar manner as the first pulse generating circuit 11a. More specifically, in response to the rise of the clock signal applied to pad PAD2, the output signal of NAND circuit 11bb rises and after the lapse of time τ0, the output signal from delay circuit 11bd falls to the same L level. Therefore, as long as the output signals from delay circuit 11bd and NAND circuit 11bb are both at the L level, pulse signal CLKT2 from NAND circuit 11bg is driven to the L level.

Figure 6:
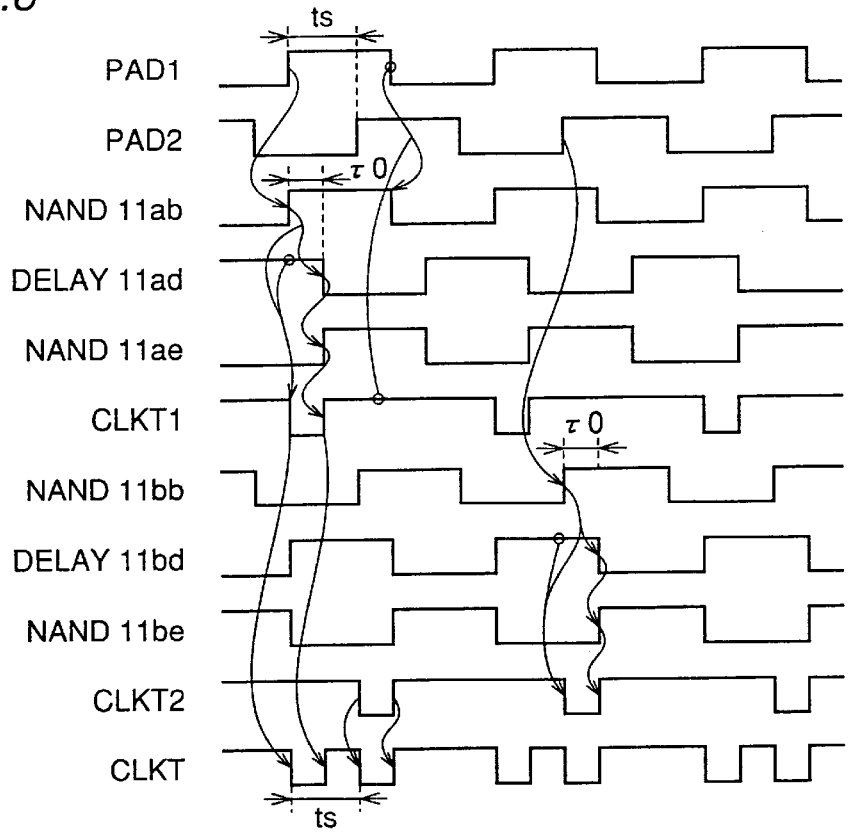
FIG. 6 is a diagram of signal waveforms representing operation of the circuit of FIG. 5.

NAND circuit 11c and inverter 11d generate the test clock signal CLKT in accordance with the pulse signals CLKT1 and CLKT2. Therefore, as shown in FIG. 6, by using the rise of the clock signal applied to each of the pads PAD1 and PAD2 as a trigger, the test clock signal CLKT which is kept at the L level for the prescribed time period τ0 is generated. The clock signals applied to pads PAD1 and PAD2 have the same cycle period, and even if it is relatively long, the test clock signal CLKT having the cycle period corresponding to the skew (time ts) between clock signals applied to pads PAD1 and PAD2 can be generated, and therefore a high speed test clock signal can be generated. The test clock signal CLKT is driven to the L level in response to the rise of the clock signals applied to pads PAD1 and PAD2, in order to be adapted to the logics of the internal clock generating circuit, which will be described later.

Figure 7:
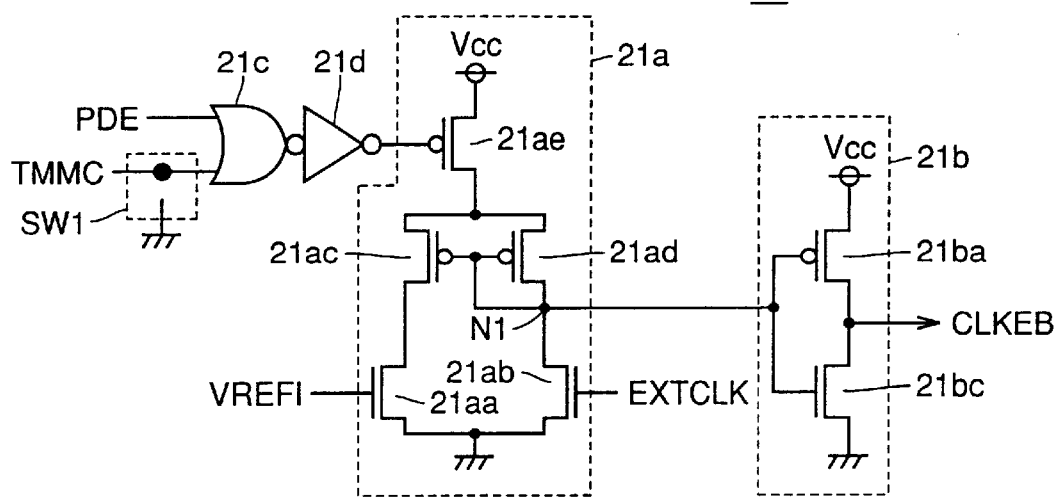
FIG. 7 is a diagram representing configuration of a standby CLK input buffer of FIG. 3.

FIG. 7 shows configuration of standby CLK input buffer 21 shown in FIG. 3. Referring to FIG. 7, standby CLK input buffer 21 includes a differential amplifier 21a comparing a reference voltage VREF1 with external clock signal EXTCLK when activated, a CMOS inverter 21b amplifying an output signal from differential amplifier 21a and generating a signal CLKEB at a CMOS level, an NOR circuit 21c receiving power down enable signal PDE and test mode designating signal TMMC, and an inverter 21d for activating/inactivating differential amplifier 21a by inverting an output signal from NOR circuit 21c. Test mode designating signal TMMC is applied through a switch circuit SW1 to NOR circuit 21c. Switch circuit SW1 is provided for switching between wafer level test and test after packaging, and for switching between clock input pads to be used. In a test after packaging, switch circuit SW1 fixes test mode designating signal TMMC to a ground voltage level. This will be described in detail later.

Differential amplifier 21a has a configuration of a current mirror type differential amplifying circuit and includes n channel MOS transistors 21aa and 21ab constituting a comparing stage for comparing reference voltage VREF1 with external clock signal EXTCLK, p channel MOS transistors 21ac and 21ad constituting a current mirror stage supplying current to the comparing stage, and a p channel MOS transistor 21ae rendered conductive when an output signal from inverter 21d is at the L level, for coupling the current mirror stage to a power supply node Vcc. The p channel MOS transistor 21ad has its gate and drain coupled to an output node N1 and constitutes a master of the current mirror stage.

Figure 8:
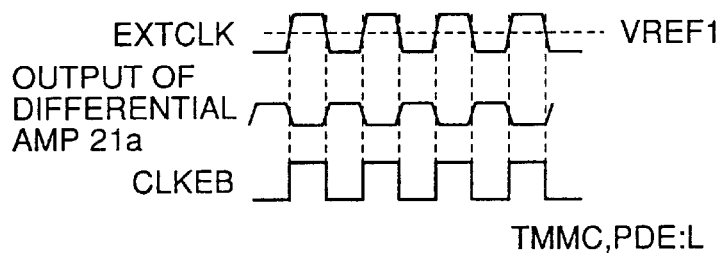
FIG. 8 is a diagram of signal waveforms representing operation of the circuit of FIG. 7.

CMOS inverter 21d includes a p channel MOS transistor 21ba and an n channel MOS transistor 21bc. The operation of standby CLK input buffer 21 shown in FIG. 7 will be described with reference to the diagram of signal waveforms of FIG. 8.

In the normal operation mode, power down enable signal PDE and test mode designating signal TMMC are both at the L level, the output signal from NOR circuit 21c is at the H level and, accordingly, the output signal of inverter 21d attains to the L level. In this state, in differential amplifier 21a, MOS transistor 21ae is rendered conductive and a current is supplied from the power supply node to MOS transistors 21ac and 21ad of the current mirror stage. Conductances of MOS transistors 21aa and 21ab are determined in accordance with the voltage levels of reference voltage VREF1 and external clock signal EXTCLK. When the voltage level of external clock signal EXTCLK is higher than that of reference voltage VREF1, the current flowing through MOS transistor 21ab is larger than the current flowing through MOS transistor 21aa, and accordingly, the current flowing through MOS transistor 21ad increases. As the current flowing through MOS transistor 21ad increases, voltage level at node N1 (gate of MOS transistor 21ad) decreases, and CMOS inverter 21b amplifies the output signal of differential amplifier 21a and generates the signal CLKEB at the CMOS level.

Conversely, when the voltage level of external clock signal EXTCLK is lower than the reference voltage VREF1, the current flowing through MOS transistor 21aa becomes larger than the current flowing through MOS transistor 21ab. At this time, as the current flowing through MOS transistor 21ad decreases, voltage level at node N1 increases, and CMOS inverter 21d outputs a signal at the L level. The voltage level of node N1 is mostly determined by the ratio of conductances between MOS transistors 21ad and 21ab, and amplitude of the signal from output node N1 is small. The signal of small amplitude from differential amplifier 21a is amplified by CMOS inverter 21b and the signal at the CMOS level is generated. As the differential amplifier 21a is used, even when external clock signal EXTCLK is a high speed clock signal with small amplitude, internal signal CLKEB at the CMOS level in synchronization with the external clock signal EXTCLK can be generated accurately.

In the self refresh mode, power down enable signal PDE is set to the H level. In this case, the output signal from inverter 21a attains to the H level, differential amplifier 21a is set to the inactive state, the voltage level of node N1 attains to the ground voltage level and, in response, the signal CLKEB is fixed at the level of the power supply voltage Vcc. By the power down enable signal PDE, differential amplifier 21a is inactivated, and current consumption in a power down mode (low power consumption mode) such as the self refresh mode is reduced.

By the signal CLKEB from standby CLK input buffer 21, control signal CLKW for determining the width of the internal clock signal is generated.

Figure 9:
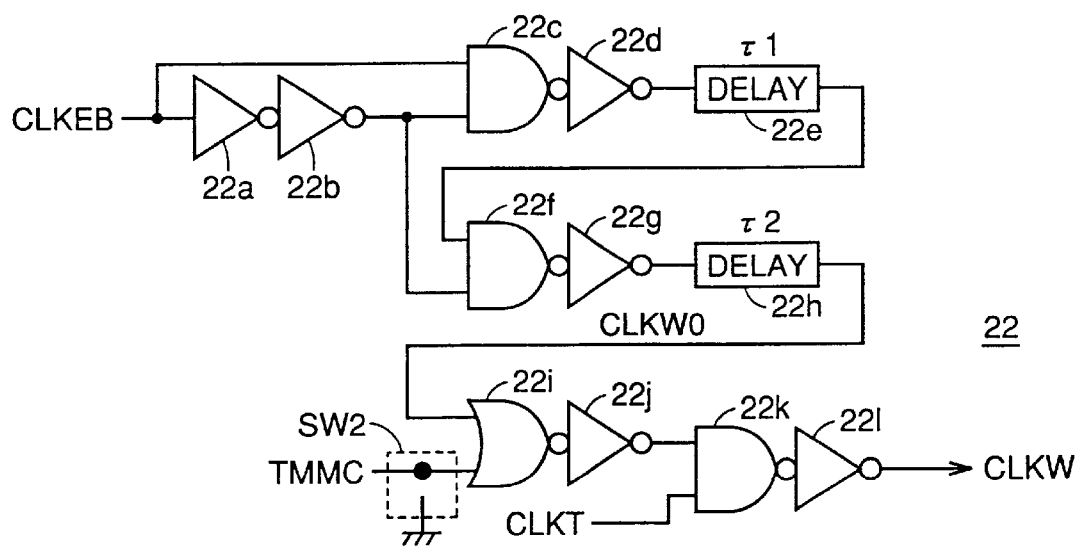
FIG. 9 is a diagram representing configuration of an INTCLK width determining circuit of FIG. 3.
Figure 10:
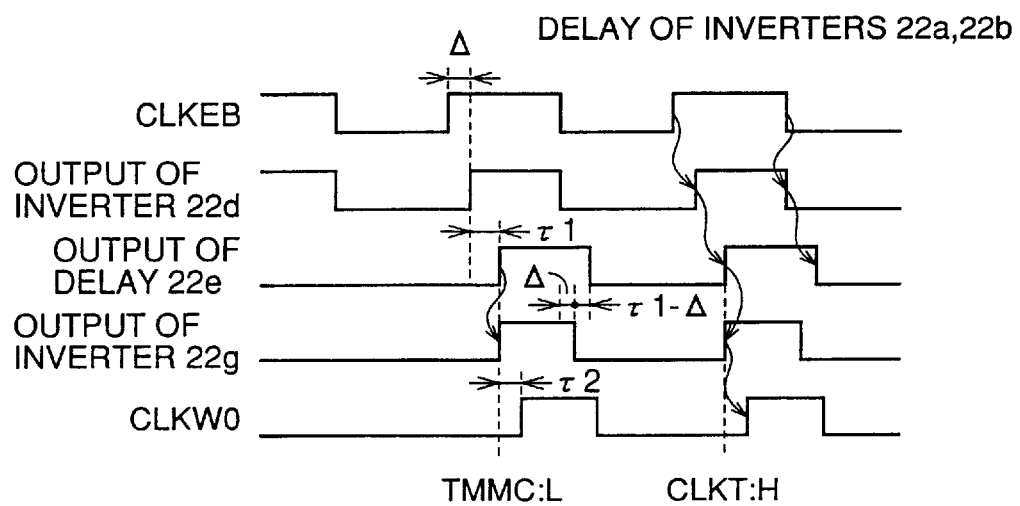
FIG. 10 is a diagram of signal waveforms representing operation of the circuit shown in FIG. 9.

FIG. 9 shows configuration of INTCLK (internal clock signal) width determining circuit 22 shown in FIG. 3. Referring to FIG. 9, INTCLK width determining circuit 22 includes two stages of inverters 22a and 22b receiving the signal CLKEB from standby CLK input buffer 21 shown in FIG. 7, an NAND circuit 22c receiving an output signal from inverter 22b and the signal CLIEB, an inverter 22d receiving an output signal from NAND 22c, a delay circuit 22e for delaying by a prescribed time τ1 and outputting the output signal from inverter 22d, an NAND circuit 22f receiving an output signal from inverter 22b and an output signal from delay circuit 22e, an inverter 22g receiving an output signal from NAND circuit 22f, a delay circuit 22h delaying by a prescribed time τ2 and outputting the output signal from inverter 22g, an NOR circuit 22i receiving an output signal from delay circuit 22h and test mode designating signal TMMC applied through switch circuit SW2, an inverter 22j receiving an output from NOR circuit 22i, an NAND circuit 22k receiving an output signal from inverter 22j and test clock signal CLKT, and an inverter 22l inverting an output signal from NAND circuit 22k and outputting clock width control signal CLKW. Switch circuit SW2 transmits test mode designating signal TMMC for the wafer level test using two pads, and fixes the test mode designating signal TMMC to the ground voltage level for the test after packaging or for a test using an external clock input pad. The operation of INTCLK width determining circuit 22 shown in FIG. 9 will be described with reference to the diagram of signal waveforms of FIG. 10.

In the normal operation mode in which test mode designating signal TMMC is at the L level, test clock signal CLKT is fixed at the H level. Therefore, in the normal operation mode, NOR circuit 21i, inverter 22j, NAND circuit 22k and inverter 22l operate as one buffer in combination, and in accordance with the signal CLKW0 from delay circuit 22h, generate the clock width control signal CLKW determining the width of the internal clock signal.

In the normal operation mode, the signal CLKEB from standby CLK input buffer 21 shown in FIG. 7 changes in accordance with the external clock signal EXTCLK. Inverters 22a and 22b, NAND circuit 22c and inverter 22d constitute a rising delay circuit, and generate a signal by delaying the rise of the signal CLKEB by a prescribed time period Δ. The rise delay time Δ is given by the delay time of inverters 22a and 22b. Delay circuit 22e outputs the signal applied from inverter 22d with a delay of prescribed time τ1. Therefore, from delay circuit 22e, a signal which is delayed by the time period Δ+τ1 from the rise of the signal CLKEB and delayed by τ1 from the fall of the signal CLKEB is output.

NAND circuit 22f and inverter 22g constitute an AND circuit, and when the output signal from inverter 22g and the output signal from delay circuit 22e are both at the H level, output a signal at the H level from inverter 22g. When the delay time Δ of inverters 22a and 22b is shorter than the delay time τ1 of the delay circuit 22e, a signal which rises in synchronization with the rise of the output signal from delay circuit 22e and falls in synchronization with the fall of the output signal from inverter 22b is output from inverter 22g (τ1−Δ>0).

Delay circuit 22h outputs the output signal of inverter 22g delayed by the time τ2. Therefore, clock width control signal CLKW has a delay time of Δ+τ1+τ2 relative to the rise of the signal CLKEB and delay time of Δ+τ2 relative to the fall of the signal CLKEB.

In the test operation mode, test mode designating signal TMMC is set to the H level, and the output signal from inverter 22j is fixed at the H level. At this time, the signal CLKEB is fixed at the H level (see FIG. 7). In this state, the clock width control signal CLKW is generated in accordance with the test clock signal CLKT.

When power down enable signal PDE is active, the signal CLKEB is fixed at the H level as shown in FIG. 7. When power down enable signal PDE is active, the test mode designating signal TMMC is set to the L level, and test clock signal CLKT is fixed at the H level. Therefore, in this state, clock width control signal CLKW is fixed at the H level (in this case, generation of the internal clock signal is stopped, as will be described later).

Figure 11:
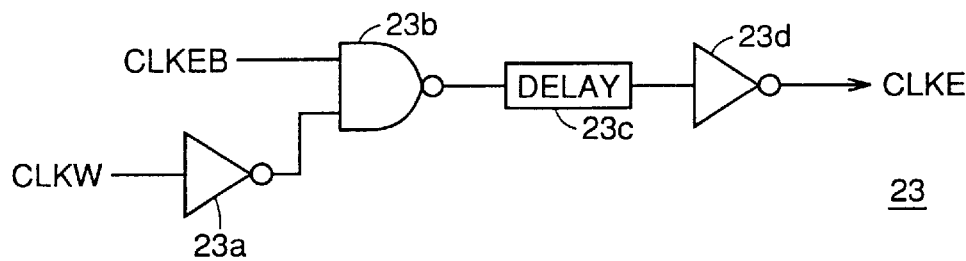
FIG. 11 is a diagram representing configuration of a CLKE generating circuit of FIG. 3.

FIG. 11 shows configuration of CLKE generating circuit 23 of FIG. 3. Referring to FIG. 11, CLKE generating circuit 23 includes an inverter 23a receiving clock width control signal CLKW, an NAND circuit 23b receiving an output signal from inverter 23a and output signal CLKEB from standby CLK input buffer 21, a delay circuit 23c for delaying by a prescribed time, the output signal from NAND circuit 23b, and an inverter 23d for generating internal clock control signal CLKE by inverting an output signal from delay circuit 23c. Operation of the CLKE generating circuit 23 shown in FIG. 11 will be described in the following.

In the test operation mode, the signal CLKEB from standby CLK input buffer 21 is fixed at the H level. Therefore, in this state, a signal which is in synchronization with the clock width control signal CLKW is output from NAND circuit 23b. In the test operation mode, the clock width control signal CLKW is synchronized with test clock signal CLKT. Therefore, internal transfer designating (transfer control) signal CLKE is the test clock signal CLKT delayed by delay circuit 23c.

The operation in the normal operation mode will be described with reference to the signal waveforms of FIG. 12.

In the normal operation mode, the signal CLKEB is synchronized with external clock signal EXTCLK, and the clock width control signal CLKW is a signal which rises and is kept at the high level for a prescribed period with a delay by the time period (Δ+τ1+τ2) behind the rise of the signal CLKEB. NAND circuit 23b outputs a signal at the L level when the signal CLKEB is at the H level and a signal CLKW is at the L level. Delay circuit 23c delays by the prescribed time period the output signal from NAND circuit 23b. Therefore, transfer control signal CLKE output from inverter 23d rises to the H level after a prescribed time period from the rise of the signal CLKEB. The duration period of H level of transfer control signal CLKE is determined by the delay time (Δ+τ1+τ2) of clock width control signal CLKW from the signal CLKEB. The transfer control signal CLKE is used for generating internal clock activating signals CKE, ZCKE and ZCKECLK shown in FIG. 3. As the rise of the signal CLKE to the H level is delayed with respect to the external clock signal, it becomes possible to take the clock control signal CKEB from CKE input buffer, delay the taken signal and generate the internal clock activating control signal, in accordance with the signal CLKE.

Figure 13:
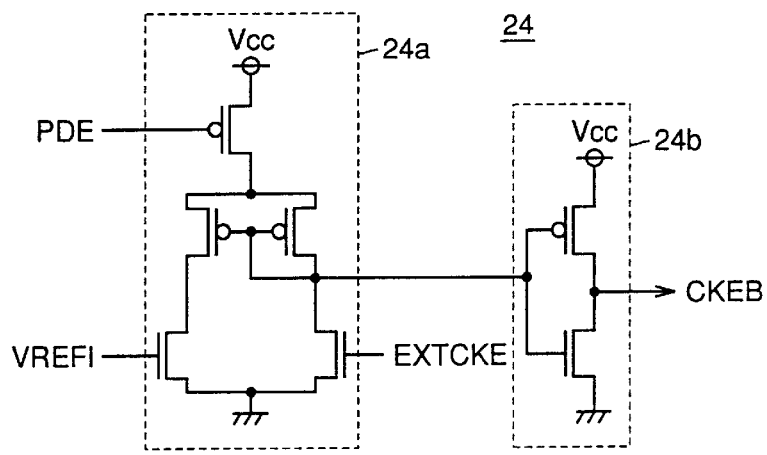
FIG. 13 is a diagram representing configuration of a CKE input buffer of FIG. 3.

FIG. 13 shows an example of the configuration of CKE input buffer 24 shown in FIG. 3. Referring to FIG. 13, CKE input buffer 24 includes a comparator 24a which is activated, when power down enable signal PDE is inactive (L level), for comparing reference voltage VREF1 with external clock enable signal EXTCKE, and a CMOS inverter 24b for inverting and amplifying an output signal from comparator 24a. Comparator 24a is constituted by a current mirror type differential amplifier, and generates a signal corresponding to voltage level difference between reference voltage VREF1 and external clock enable signal EXTCKE. Comparator 24a has the same structure as differential amplifier 21a included in standby CLK input buffer 21 shown in FIG. 7, and it determines high level/low level of a signal of small amplitude utilizing reference voltage VREF1, and CMOS inverter 24b convert she signal of small amplitude from comparator 24a to a signal of the CMOS level. Therefore, from CKE input buffer 24 shown in FIG. 13, the signal CKEB is generated in accordance with the external signal EXTCKE.

When power down enable signal PDE is active, the buffer 24 is inactivated, and the signal CKEB is fixed at the H level.

Figure 14:
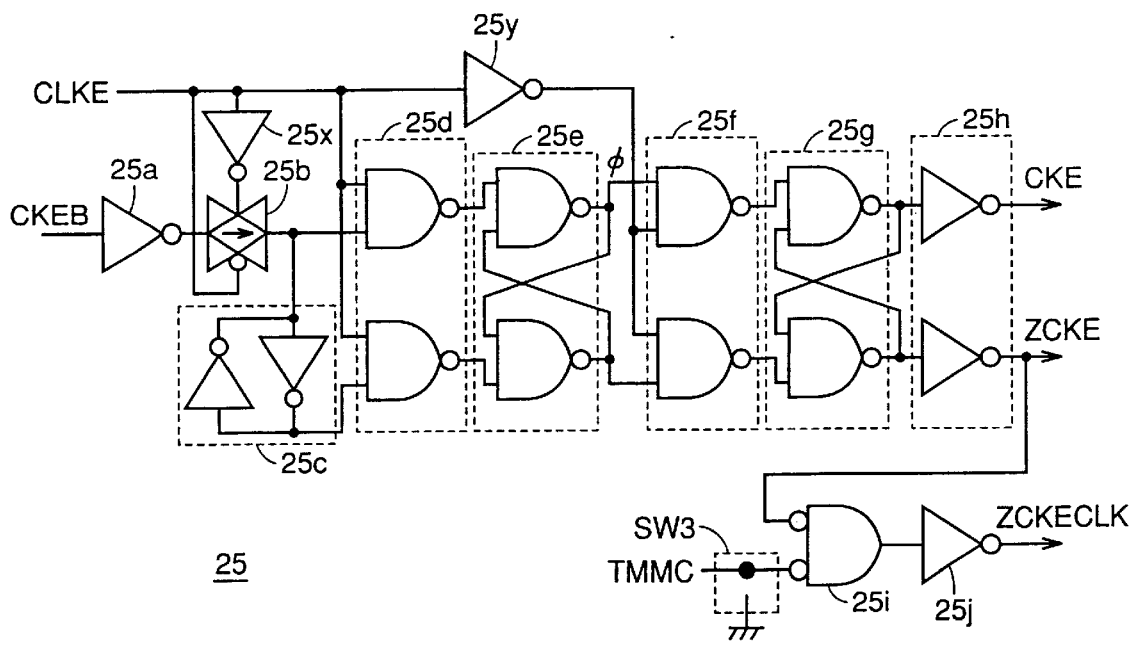
FIG. 14 is a diagram representing configuration of an INTCKE generating circuit shown in FIG. 3.

FIG. 14 shows an example of the structure of INTCKE generating circuit 25 shown in FIG. 3. Referring to FIG. 14, INTCKE generating circuit 25 includes an inverter 25a receiving the signal CKEB from CKE input buffer 24 shown in FIG. 13, a CMOS transmission gate 25b rendered conductive, when internal clock control signal CLKE from CLKE generating circuit 23 shown in FIG. 11 is at the L level, for transmitting an output signal from inverter 25a, an inverter latch 25c for latching and generating a complementary signal of the output signal from CMOS transmission gate 25b, a transfer circuit 25d activated, when transfer control signal CLKE is at the H level, for transmitting complementary data latched by inverter latch 25c, a latch circuit 25e for latching the complementary data transferred from transfer circuit 25d, a transfer circuit 25f activated, when transfer control signal CLKE is at the L level, for transferring the complementary data latched by latch circuit 25e, a latch circuit 25g for latching the complementary data transferred from transfer circuit 25f, a drive circuit 25h for generating internal clock enable signals CKE and ZCKE from the complementary data latched by latch circuit 25g, an NOR circuit 25i receiving the complemental internal clock signal ZCKE from drive circuit 25h and test mode designating signal TMMC applied through switch circuit SW3, and an inverter 25j for generating a signal ZCKECLK to be applied to CLK input buffer 26 by inverting an output signal from NOR circuit 25a.

In order to transfer the signal CKEB in accordance with transfer control signal CLKE, inverters 25x and 25y receiving transfer control signal CLKE are provided. An output signal from inverter 25x is applied to CMOS transmission gate 25b, and an output signal from inverter 25y is applied to transfer circuit 25f. Transfer circuits 25d and 25f are each constituted by a pair of NAND circuits, and latch circuits 25e and 25g are each constituted by an NAND type flip-flop. Drive circuit 25h includes a pair of inverters inverting complementary data latched by latch circuit 25e. Drive circuit 25h drives internal clock (INTCLK) generating circuit 27 with relatively large driving capability.

Figure 15:
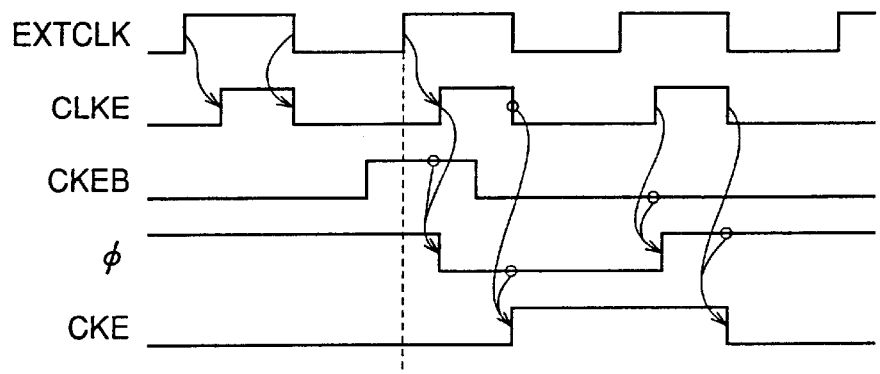
FIG. 15 is a diagram of signal waveforms representing operation of the circuit shown in FIG. 14.

In INTCKE generating circuit 25 configured as shown in FIG. 14, when test mode designating signal TMMC is at the H level, the output signal of NOR circuit 25i attains to the L level, and clock control signal ZCKECLK from inverter 25a attains to the H level. When the signal ZCKECLK is at the H level, active CLK input buffer 26, of which configuration will be described later, is inactivated, and generation of internal clock is stopped. In the test operation mode, the internal clock is generated in accordance with the test clock signal CLKT. The operation of INTCKE generating circuit 25 in the normal operation mode will be described with the signal waveforms of FIG. 15.

Figure 12:
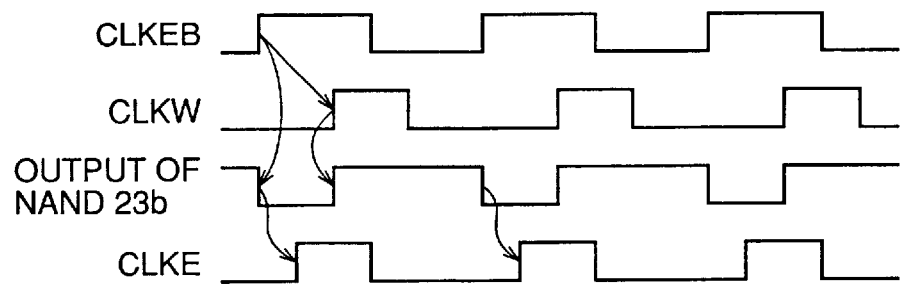
FIG. 12 is a diagram of signal waveforms representing operation of the circuit of FIG. 11.

In the normal operation mode, internal clock control signal CLKE rises to the H level with a delay by a prescribed time period to the rise of external clock signal EXTCLK, and falls in response to the fall of external clock signal EXTCLK (see FIGS. 11 and 12). When transfer control signal CLKE is at the L level, CMOS transmission gate 25b is rendered conductive, allowing passage of the signal applied from inverter 25a. The signal transmitted through CMOS transmission gate 25b is latched by inverter latch 25c. When transfer control signal CLKE is at the L level, transfer circuit 25d is inactive, and data latched in inverter latch 25c is not transferred. On the other hand, transfer circuit 25f is activated, and therefore the complementary signals latched in latch circuit 25e are transmitted. Therefore, when the signal Φ latched in latch circuit 25e is at the H level, clock enable signal CKE attains to the L level.

When transfer control signal CLKE rises to the H level, CMOS transmission gate 25b is rendered non-conductive, and INTCKE generating circuit 25 is set to the latch state. In response to the rise of transfer control signal CLKE, transfer circuit 25d is activated, and the complementary signals latched by inverter latch 25c are transferred to latch circuit 25e. In this cycle, when the signal CKEB is at the L level, the signal Φ latched in latch circuit 25e is kept at the H level. Meanwhile, transfer circuit 25f is inactivated in response to the rise of transfer control signal CLKE, and therefore latch circuits 25e and 25g are isolated from each other. In this state, in accordance with the signals latched in latch circuit 25g, internal clock enable signals CKE, ZCKE and ZCKECLK are output.

At the rising edge of external clock signal EXTCLK, when external clock enable signal CKE is set to the H level, the signal CKEB also rises to the H level in response. When transfer control signal CLKE is at the L level, the H level signal CKEB is transmitted through inverter 25a and CMOS transmission gate 25b and latched by inverter latch 25c. When transfer control signal CLKE rises to the H level, transmission gate 25b is rendered non-conductive, transfer circuit 25d is activated, and data latched by inverter latch 25c is transferred to and latched by latch circuit 25e. Therefore, the signal Φ latched by latch circuit 25b falls to the L level in response to the rise of transfer control signal CLKE. Thereafter, when transfer control signal CLKE falls to the L level, CMOS transmission gate 25b is rendered conductive, and transmits the signal CKEB at the L level. However, transfer circuit 25d is inactive, and therefore signal is not transmitted from CMOS transmission gate 25b. Transfer circuit 25f is activated in response to the fall of transfer control signal CLKE, and the complementary signals latched in latch circuit 25e are transmitted to latch circuit 25g. Therefore, in response to the signal Φ latched by latch circuit 25e and a fall of transfer control signal CLKE, internal clock signal CKE falls to the H level. The signal Φ latched by latch circuit 25e is kept at the L level until transfer control signal CLKE next attains to the H level. Internal clock enable signal CKE is kept at the H level until the next fall of transfer control signal CLKE to the L level.

Therefore, the INTCKE generating circuit 25 shown in FIG. 14 takes the signal CKEB in response to the rise of transfer control signal CLKE, and outputs the taken signal as the internal clock enable signal in response to the fall of transfer control signal CLKE. When the clock enable signal CKE is at the L level, generation of the internal clock signal is stopped. Therefore, when the external clock enable signal is set to the inactive state of L level, generation of the internal clock signal is stopped in the next clock cycle.

Figure 16:
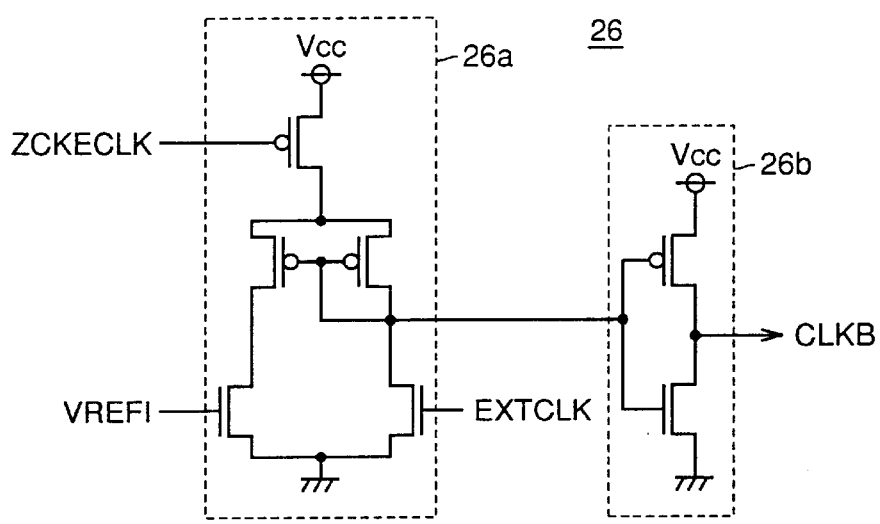
FIG. 16 is a diagram representing configuration of an active CLK input buffer shown in FIG. 3.

FIG. 16 shows a configuration of active CLK input buffer 26 of FIG. 3. Active CLK input buffer 26 includes a differential amplifier 26a which is activated, when the signal ZCKECLK is activated (L level), for differentially amplifying reference voltage VREF1 and external clock signal EXTCLK, and a CMOS inverter 26b for amplifying an output signal from differential amplifier 26a to generate a signal CLKB of the CMOS level. In active CLK input buffer 26 also, by comparing external clock signal EXTCLK with reference voltage VREF1, it is possible to accurately determine high level/low level of the external clock signal having small amplitude and to generate the internal clock signal CLKB of the CMOS level.

When the signal ZCKECLK is at the inactive state of H level, differential amplifier 26a is inactive, the output signal thereof is fixed at the L level and, in response, the signal CLKB is fixed at the H level. The signal ZCKECLK is driven to the inactive state of H level when the external clock enable signal EXTCKE is set to the inactive state of L level and when the test mode designating signal TMMC is set to the H level, and in this state, the operation of generating a clock signal in accordance with the external clock signal EXTCLK is stopped in the next clock cycle.

Figure 17:
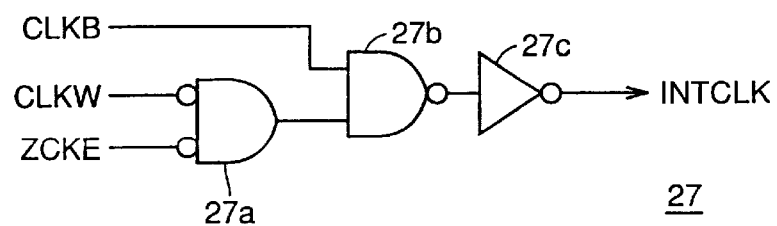
FIG. 17 is a diagram representing configuration of the INTCLK generating circuit shown in FIG. 3.

FIG. 17 shows configuration of INTCLK generating circuit 27 for generating the internal clock signal INTCLK shown in FIG. 3. Referring to FIG. 17, INTCLK generating circuit 27 includes an NOR circuit 27a receiving signals CLKW and ZCKE, an NAND circuit 27b receiving clock signal CLKB and an output signal from NOR circuit 27a, and an inverter 27c for generating internal clock signal INTCLK by inverting an output signal from NAND circuit 27b.

In the test operation mode, the signal ZCK-TCLK is fixed at the H level, active CLK input buffer 26 shown in FIG. 16 is set to the inactive state, and the signal CLKB is fixed at the H level. Clock width control signal CLKW is generated in accordance with the test clock signal CLKT in the test operation mode. Therefore, internal clock signal INTCLK changes in accordance with test clock signal CLKT through the signal CLKW, in the test operation mode.

In the normal operation mode, signal CLKB changes in synchronization with the external clock signal, the pulse width thereof is adjusted by the clock width control signal CLKW, and the internal clock signal INTCLK having a constant pulse width is generated in synchronization with the external clock signal. The operation of the overall clock generating circuitry shown in FIGS. 3 to 17 will be described in the following.

Figure 18:
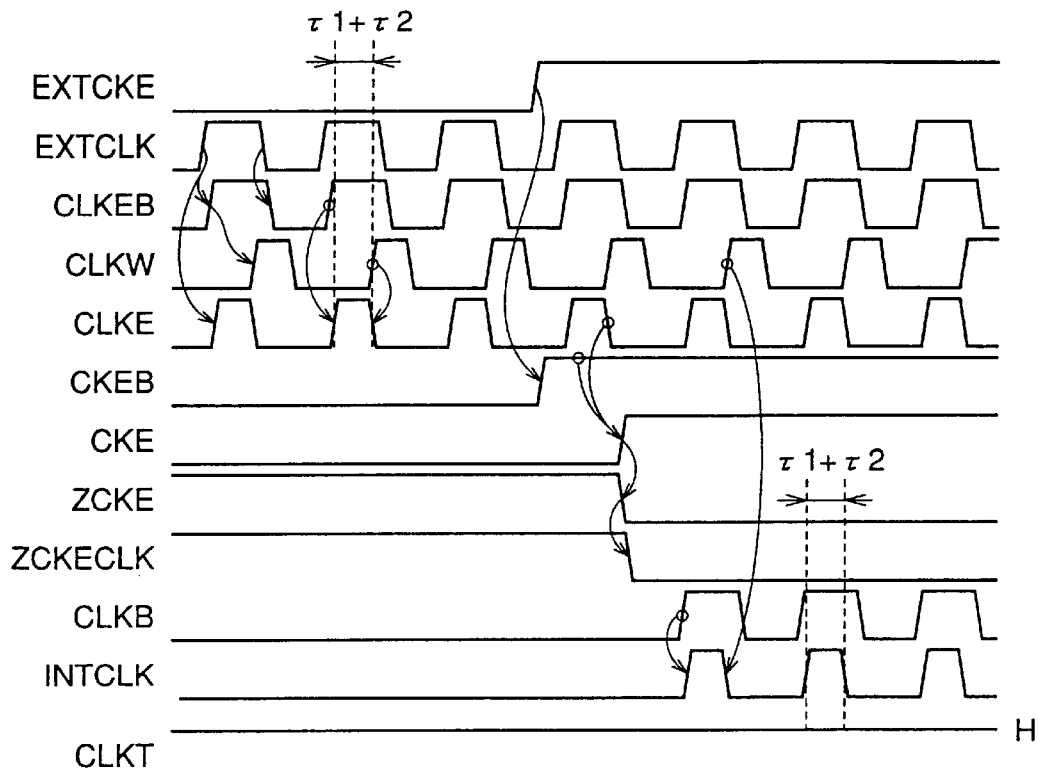
FIGS. 18 and 19 are diagrams of signal waveforms representing operation of clock generating circuitry shown in FIG. 3.

First, referring to FIG. 18, operation in the normal operation mode will be described. In the normal operation mode, test clock signal CLKT is fixed at the H level, as shown in FIG. 5.

In accordance with external clock signal EXTCLK, standby CLK input buffer 21 shown in FIG. 7 operates and generates control signal CLKEB. In accordance with the control signal CLKEB, INTCLK width determining circuit 22 of FIG. 9 generates the signal CLKW. The signal CLKW rises with a delay of τ1+τ2 relative to the signal CLKEB. In accordance with the signals CLKEB and CLKW, CKE generating circuit 23 shown in FIG. 11 operates, and generates the signal CLKE which rises in response to the rise of the signal CLKEB and falls in response to the fall of the signal CLKW. These signals CLKEB, CLKW and CLYE are generated regardless of the H level/L level of external clock enable signal EXTCKE. When external clock enable signal EXTCKE is at the L level, the signal CKEB from CKE input buffer 24 shown in FIG. 13 is kept at the L level and, in response, the signal CKE from INTCKE generating circuit 25 shown in FIG. 14 is kept at the L level, while the signals ZCKE and ZCKECLK are held at the H level. When the signal ZCKECLK is at the H level, active CLK input buffer 26 shown in FIG. 16 is held at the inactive state, and a signal CLKB is fixed at the H level. Therefore, internal clock signal INTCLK from INTCLK generating circuit 27 shown in FIG. 17 is kept at the L level.

When external clock enable signal EXTCKE is driven to the H level, the signal CKEB from CKE input buffer 24 shown in FIG. 13 rises to the H level. When the signal CKEB rises to the H level, the signal CKE from INTCKE generating circuit 25 shown in FIG. 14 rises to the H level in response to the fall of the signal CLKE from CLKE generating circuit 23 shown in FIG. 11, and the signals ZCKE and ZCKECLK fall to the L level. When the signal ZCKECLIK falls to the L level, active CLK input buffer 26 shown in FIG. 16 is activated, and generates clock signal CLKB in accordance with the external clock signal EXTCLK. When the signal CLKB rises to the H level, internal clock signal INTCLK from INTCLK generating circuit 27 shown in FIG. 17 which in turn is activated by the activation of the signal ZCKE rises to the H level.

When the clock width control signal CLKW rises to the H level, internal clock signal INTCLK falls to the L level. Accordingly, internal clock signal INTCLK is kept at the H level for the period corresponding to the delay time (τ1+τ2) of clock width control signal CLKW, and regardless of the pulse width fluctuation of external clock signal EXTCLK, the internal clock signal INTCLK having constant pulse width is generated.

The operation in the test operation mode will be described with reference to FIG. 19.

In the test operation mode, external clock enable signal EXTCKE is fixed at the H level. In this state, when test mode designating signal TMMC is at the L level, the signals CLKB and CLKEB are generated in accordance with external clock signal EXTCLK. In the test operation mode, test mode designating signal TMMC is set to the H level. When the test mode designating signal TMMC is set to the H level, the signal ZCKECLK from INTCKE generating circuit 25 shown in FIG. 14 is fixed at the H level, and active CLK input buffer 26 is set to the inactive state. Therefore, in this state, regardless of the state of external clock signal EXTCLK, the signal CLKB from active CLK input buffer 26 is fixed at the H level (see FIG. 16).

Standby CLK input buffer 21 is also inactivated in response to activation (H level) of test mode designating signal TMMC, and the signal CLKEB is fixed at the H level. Further, referring to FIG. 9, INTCLK width determining circuit 22 outputs test clock signal CLKT as clock width determining signal CLKW in response to activation of the test mode designating signal TMMC. Further, standby CLK input buffer 21 is inactivated and the signal CLKEB is fixed at the H level and therefore, CLKE generating circuit 23 outputs the signal CLKE in accordance with test clock signal CLKT, through clock width control signal CLKW, as shown in FIG. 11. Therefore, when external clock enable signal EXTCKE is lowered to the L level, INTCKE generating circuit 25 may generate clock enable signals CKE and ZCKE in accordance with the test clock signal CLKT.

In the test operation mode, clock signals from the tester are applied to pads PAD1 and PAD2. The clock signals from the tester have the cycle period tc and the time ts as a skew between clocks. As shown in FIG. 5, test CLK generating circuit 11 generates a pulse signal which falls to the L level for a prescribed time period (time τ0) in response to the rise of the clock signal applied to pads PAD1 and PAD2. In accordance with pulse signals CLKT1 and CLKT2 generated using the rising edge of the clock signals applied to pads PAD1 and PAD2 as a trigger, test clock signal CLKT is generated, and a signal obtained by inverting test clock signal CLKT is output as internal clock signal INTCLK from INTCLK generating circuit 27 shown in FIG. 17. Internal circuitry operates in accordance with the internal clock signal INTCLK. Therefore, though pulse interval of internal clock signal INTCLK is non-uniform, it is possible to operate the internal circuitry with the interval of ts being the minimum interval. By applying various commands as shown in FIG. 4 at the rising edges of the clock signals applied to pads PAD1 and PAD2, timing margin of the SDRAM can be measured. For example, when a clock signal is applied through PAD1, active command ACT is applied at a rising edge of the clock signal, and a read command READ or a write command WRITE is applied in synchronization with a rising edge of the clock signal from pad PAD2, timing margin of RAS-CAS delay time tRCD can be measured.

In the foregoing, specific configuration of test mode entry circuit 12 is not described. By setting row address strobe signal /RAS, column address strobe signal /CAS and write enable signal /WE all to the L level at a rising edge of external clock signal EXTCLK, and by setting a specific address signal bit ADDRESS to a predetermined logic state, the test mode is designated, and by latching a trigger signal indicating the designated test mode, the test mode designating signal TMMC is set. This can readily be implemented by common circuitry which identifies determines "WCBR+ address key" condition.

Figure 19:
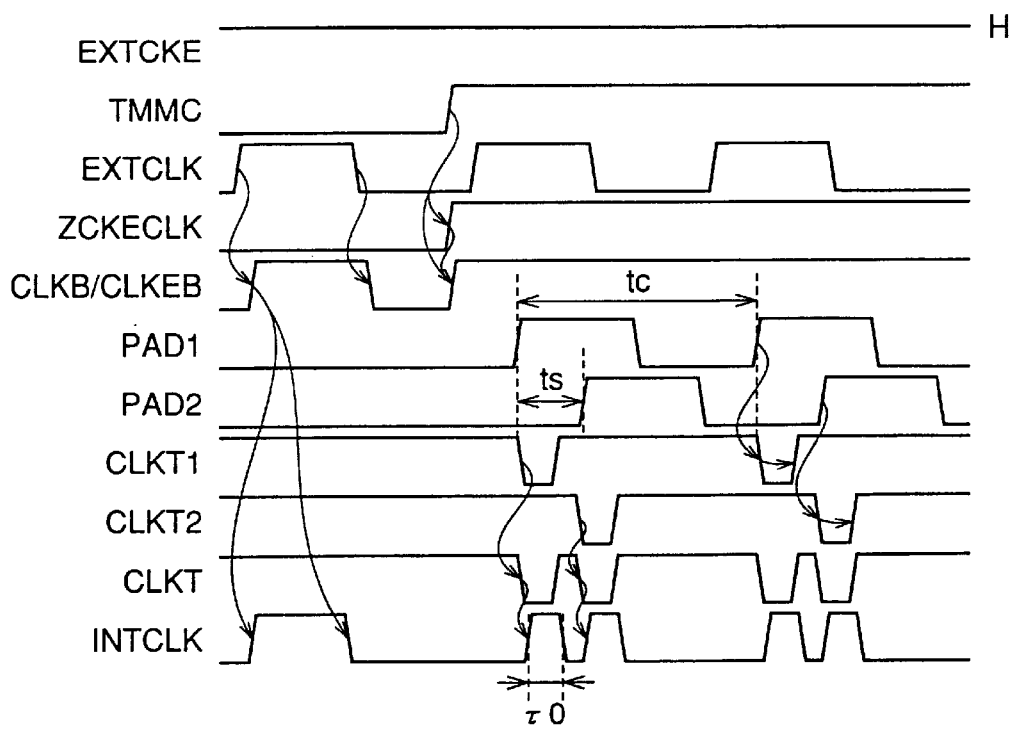

In the test operation mode, in the signal waveforms of FIG. 19, external clock signal EXTCLK is applied repeatedly. However, in the test operation mode, external clock signal EXTCLK may be fixed at the L level or the H level.

Figure 20:
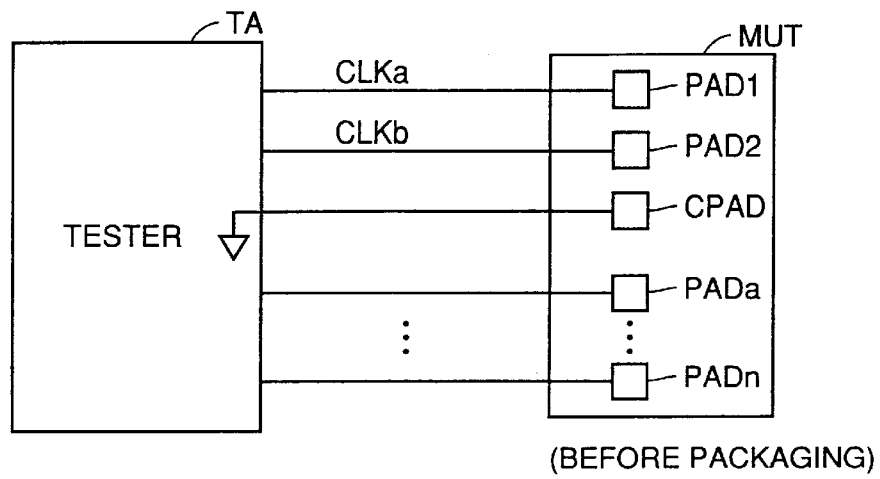
FIG. 20 schematically represents connection between a tester and a memory under test when the clock generating circuitry shown in FIG. 3 is used.

FIG. 20 schematically shows an example of arrangement of the SDRAM at the time of testing. Referring to FIG. 20, a tester TA is coupled to a memory under test MUT. Memory under test MUT includes pads PAD1 and PAD2 receiving clock signals CLKa and CLKb from tester TA, respectively, and a clock input pad CPAD receiving external clock signal EXTCLK in the normal operation mode. Clock input pad CPAD is connected to an external pin terminal through a bonding wire at the time of packaging. In the test operation mode, clock input pad CPAD is fixed at a prescribed potential level by tester TA. To pads PADa to PADn of memory under test MUT, signals are applied from tester TA. These pads PADa to PADn may include a data input/output pad.

Even when tester TA operates at a low speed and clock signals CLKa and CLKb are clock signals of low speed, it is possible for tester TA to set the skew of clock signals CLKa and CLKb to as small as a few nanoseconds for measuring setup/hold time, for example. Therefore, even when tester TA cannot apply a high speed clock signal to clock input pad CPAD, it is possible to operate the internal circuitry at high speed by applying clock signals of different phases to pads PAD1 and PAD2 to generate the test clock signal. As such two phase clock signals are used, by additionally providing a circuit for generating a test clock in the clock generating circuitry and partially modifying configuration of INTCLK width determining circuit, the internal clock signal changing at the required speed can readily be generated in the test operation mode, and therefore a high speed memory device can be tested by a low speed tester while hardly increasing the chip area.

Clock generating circuitry configuration 2

Figure 21:
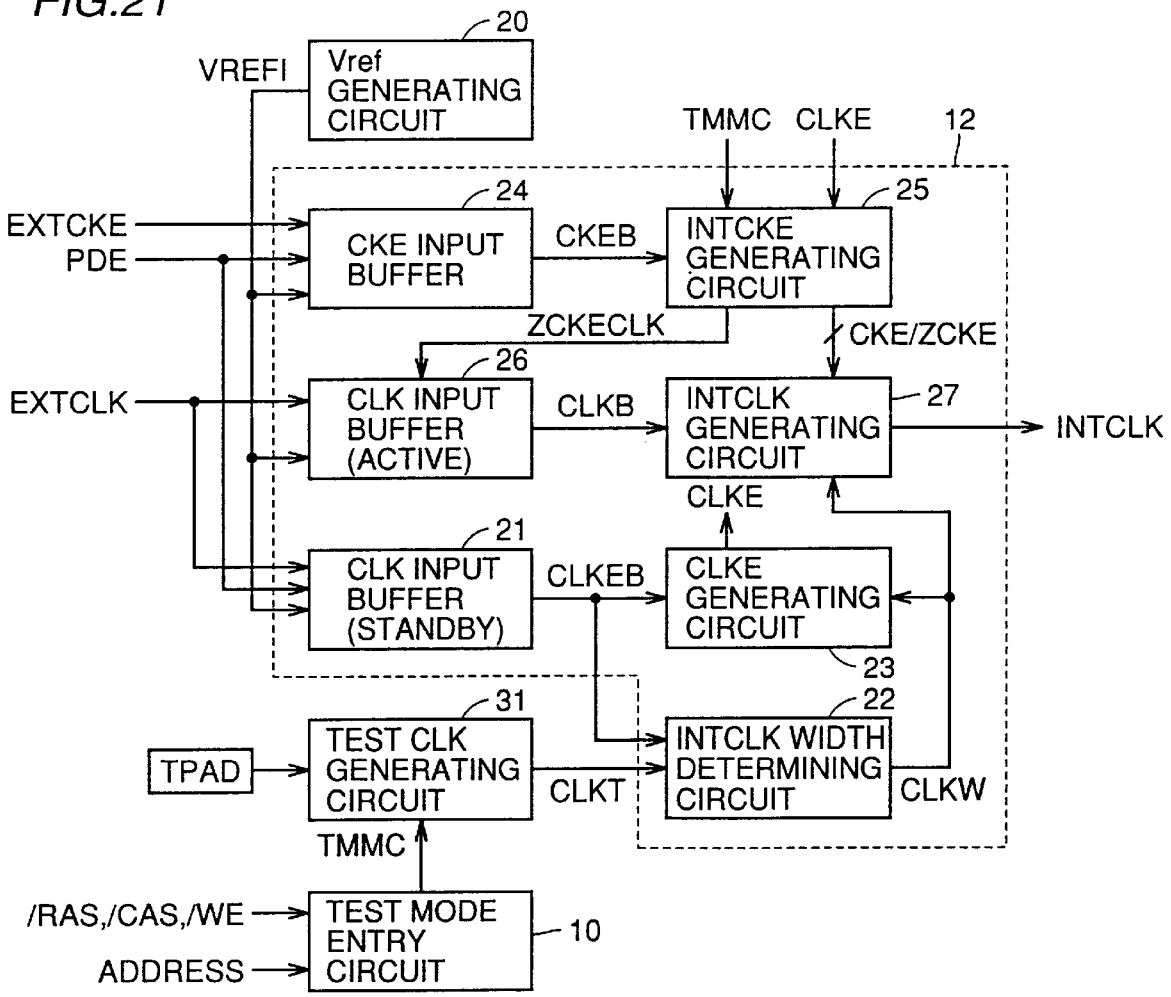
FIG. 21 schematically represents a second configuration of the clock generating circuitry shown in FIG. 2.

FIG. 21 schematically shows a second configuration of the clock generating circuitry of the SDRAM in accordance with the present invention. In the configuration of the clock generating circuitry shown in FIG. 21, test mode designating signal TMM from test mode entry circuit 10 is applied to test CLK generating circuit 31. Test mode designating signal TMMC is not applied to CLK input buffer 21 and INTCLK width determining circuit 22. Therefore, CLK input buffer 21 and INTCLK width determining circuit 22 operate in the similar manner as in the normal operation mode, even in the test operation mode. When test mode designating signal TMMC is activated, testing CLK generating circuit 31 generates a one shot pulse signal in accordance with the clock signal applied through a pad TPAD. Therefore, the test clock signal CLKT is a one shot pulse signal which is synchronized with the clock signal applied from the low speed tester. Here, as the external clock signal EXTCLK, the clock signal is applied from the tester, and in INTCLK generating circuit 27, the test clock signal CLKT from test CLK generating circuit 31 and the clock signal EXTCLK of the external circuitry are combined to generate internal clock signal INTCLK. Even when external clock signal EXTCLK is at a low speed, internal clock signal INTCLK which is at a higher speed (high frequency) than the external clock signal EXTCLK can be generated, as the test clock signal CLKT from testing CLK generating circuit 31 and external clock signal EXTCLK are combined.

The configuration shown in FIG. 21 requires a pad for receiving the external clock signal and the pad TPAD for receiving the test clock signal. Therefore, only one additional pad may be needed for testing, and the number of pads can be reduced. Therefore, even when the chip area is limited, it is possible to operate the internal circuitry at high speed by using low speed clock signal. Configurations of various portions will be described in the following.

Figure 22:
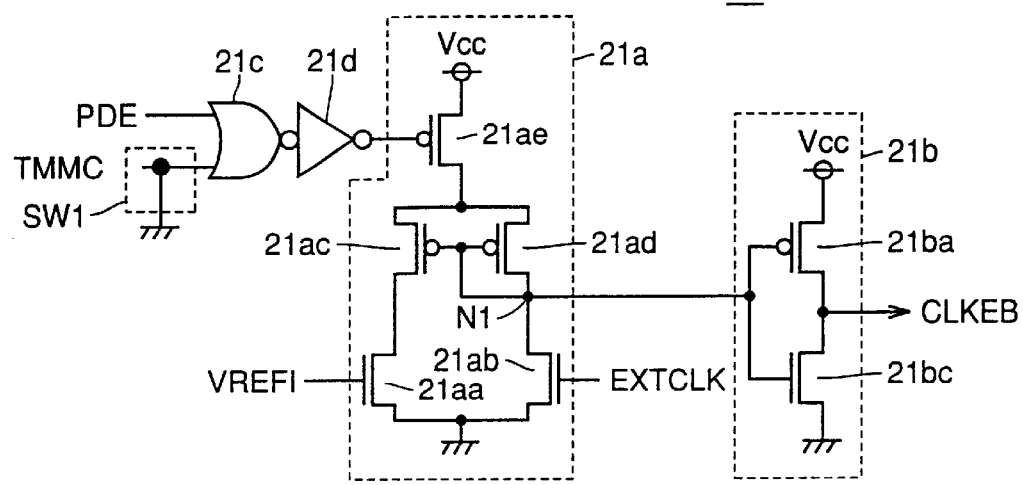
FIG. 22 is a diagram representing configuration of a standby CLK input buffer shown in FIG. 21.

FIG. 22 shows configuration of standby CLK input buffer 21 of FIG. 21. In standby CLK input buffer 21 shown in FIG. 22, switch circuit SW1 selects the ground voltage and applies it to NOR circuit 21c, in place of test mode designating signal TMMC. Other portions are the same as those of standby CLK input buffer 21 shown in FIG. 7, and corresponding portions are denoted by the same reference characters. Therefore, standby CLK input buffer 21 shown in FIG. 22 generates internal signal CLKEB in accordance with external clock signal EXTCLK when power down enable signal PDE is at the L level, even in the test operation mode.

Figure 23:
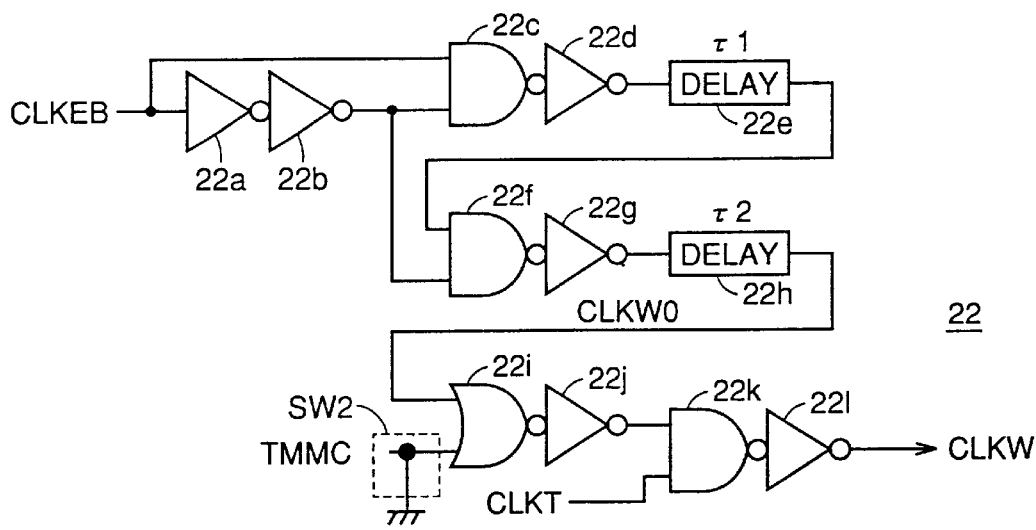
FIG. 23 is a diagram representing configuration of an INTCLK width determining circuit shown in FIG. 21.
Figure 24:
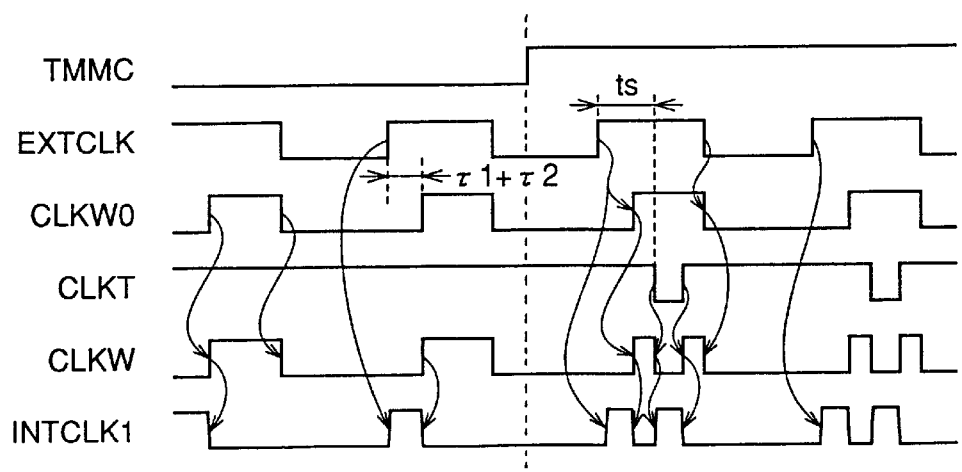
FIG. 24 is a diagram of signal waveforms representing operation of the circuit shown in FIG. 23.

FIG. 23 shows configuration of INTCLK width determining circuit 22 of FIG. 21. In INTCLK width determining circuit 22 shown in FIG. 23 also, switch circuit SW selects and applies to NOR circuit 22i the ground voltage in place of test mode designating signal TMMC. In INTCLK width determining circuit 22, test clock signal CLKT and clock width control signal CLKW0 are combined by NAND circuit 22k. Other portions have the same structure as those shown in FIG. 9, and corresponding portions are denoted by the same reference characters. Operation of INTCLK width determining circuit 22 shown in FIG. 23 will be briefly described with reference to FIG. 24.

In the normal operation mode, signal CLKEB changes in accordance with external clock signal EXTCLK as shown in FIG. 22. After the lapse of delay times τ1 and τ2 of delay circuits 22e and 22h from the rise of signal CLKEB, output signal CLKW0 of delay circuit 22h rises to the H level. Here, delay times of inverters 22a and 22b are considered negligible as compared with delay times τ1 and τ2 of delay circuits 22e and 22h. Test clock signal CLKT is kept at the H level in the normal operation mode. Therefore, clock width control circuit CLKW changes in accordance with the output signal CLKW0 of delay circuit 22h. Internal clock signal INTCLK is generated by an AND (logical product) of a signal obtained by inverting clock width control signal CLKW and external clock signal EXTCLK, as shown in FIG. 17. Therefore, internal clock signal INTCLK rises to the H level when external clock signal EXTCLK (signal CLKEB) rises, and falls to the L level when the signal CLKW rises.

In the test operation mode, referring to FIG. 22, the signal CLKEB is generated in accordance with external clock signal EXTCLK, and output signal CLKW0 of delay circuit 22h is also generated in accordance with the signal CLKEB (external clock signal EXTCLK) as in the normal operation mode. In the test operation mode, when the signal CLKW0 is at the H level, test clock signal CLKT falls to and kept at the L level for a prescribed time period. Therefore, the signal CLKW is kept at the L level as long as the test clock signal CLKT is at the L level.

Internal clock signal INTCLK rises in accordance with external clock signal EXTCLK (signal CLKEB) in the test operation mode, and falls from the H level to the L level in response to the rise of clock width control signal CLKW. At this time, however, the clock width control signal CLKW falls to the L level and external clock signal EXTCLK (CLKB) attains to the H level, so that internal clock signal INTCLK again rises to the H level, and as the test clock signal CLKT attains to the H level, the clock width control signal CLKW again attains to the H level, and internal clock signal INTCLK attains to the L level.

Accordingly, by combining external clock signal EXTCLK and test clock signal CLKT, it is possible to change internal clock signal INTCLK twice. By appropriately determining the timing skew of test clock signal CLKT and external clock signal EXTCLK, it is possible to generate a high speed internal clock signal INTCLK using the low speed clock signals EXTCLK and CLKT, as in the first embodiment.

Figure 25:
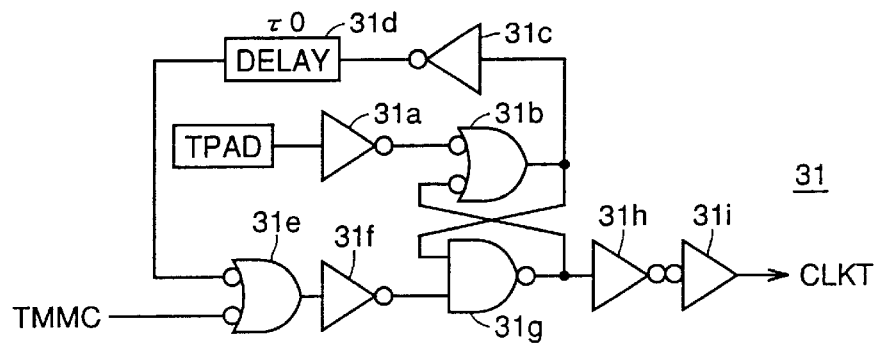
FIG. 25 is a diagram representing configuration of a test CLK generating circuit shown in FIG. 21.

FIG. 25 shows configuration of test CLK generating circuit 31 shown in FIG. 21. Referring to FIG. 25, testing CLK generating circuit 31 includes an inverter 31a inverting a signal applied to pad TPAD, an NAND circuit 31b receiving at a first input an output signal from inverter 31a, an inverter 31c inverting an output signal from NAND circuit 31b, a delay circuit 31d for delaying an output signal from inverter 31c by a prescribed time τ0, an NAND circuit 31e receiving an output signal from delay circuit 31d and test mode designating signal TMMC, an inverter 31f inverting an output signal from NAND circuit 31e, an NAND circuit 31g receiving an output signal from NAND circuit 31b and an output signal from inverter 31f, and two stages of inverters 31h and 31i receiving an output signal from NAND circuit 31g. Test clock signal CLKT is output from inverter 31i.

Testing CLK generating circuit 31 shown in FIG. 25 is equivalent to a configuration of testing CLK generating circuit 11 shown in FIG. 5 with one pulse generating circuit used. Therefore, when the clock signal applied to pad TPAD rises, test clock signal CLKT falls to the L level for the delay time τ0 of delay circuit 31d. More specifically, test clock signal CLKT is generated in the form of a one shot pulse which is kept at the L level for a prescribed time period in response to the rise of the clock signal applied to pad TPAD. In the normal operation mode, test mode designating signal TMMC is fixed at the L level, the output signal from NAND circuit 31e attains to the H level and, in response, the output signal of inverter 31f attains to the L level. Therefore, the output signal from NAND circuit 31g attains to the H level and test clock signal CLKT is fixed at the H level. Therefore, even when the pad TPAD is set to the floating state at the time of packaging, the test clock signal CLKT is surely fixed at the H level. In order to prevent the pad TPAD to be undesirably set to the floating state after packaging, a pull down element of high resistance may be connected to the pad TPAD.

Figure 26:
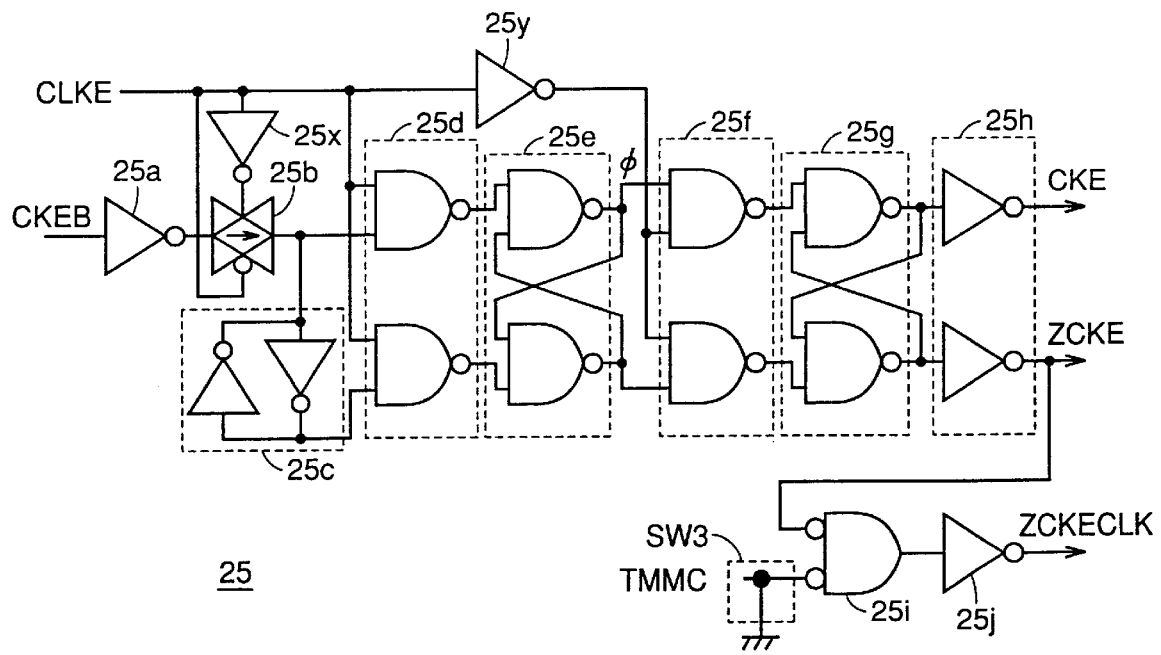
FIG. 26 is a diagram representing configuration of an INTCKE generating circuit shown in FIG. 21.

FIG. 26 shows configuration of INTCKE generating circuit 25 shown in FIG. 21. INTCKE generating circuit 25 shown in FIG. 26 differs from INTCKE generating circuit shown in FIG. 14 in configuration of switch circuit SW3. Switch circuit SW3 transmits ground voltage to NOR circuit 25i, in place of test mode designating signal TMMC. INTCKE generating circuit 25 generates internal clock activating signals CKE, ZCKE and ZCKECLK in accordance with the external clock enable signal EXTCKE (signal CKEB) even in the test mode, similar to the normal operation mode. Even in the test operation mode, in the absence of a clock mask designation (when the signal CKEB is at the H level), the signal ZCIECLK from inverter 25j is kept at the L level, so that active CLK input buffer 26 is maintained active, and generates clock signal CLKB in accordance with the external clock signal EXTCLK.

Figure 27:
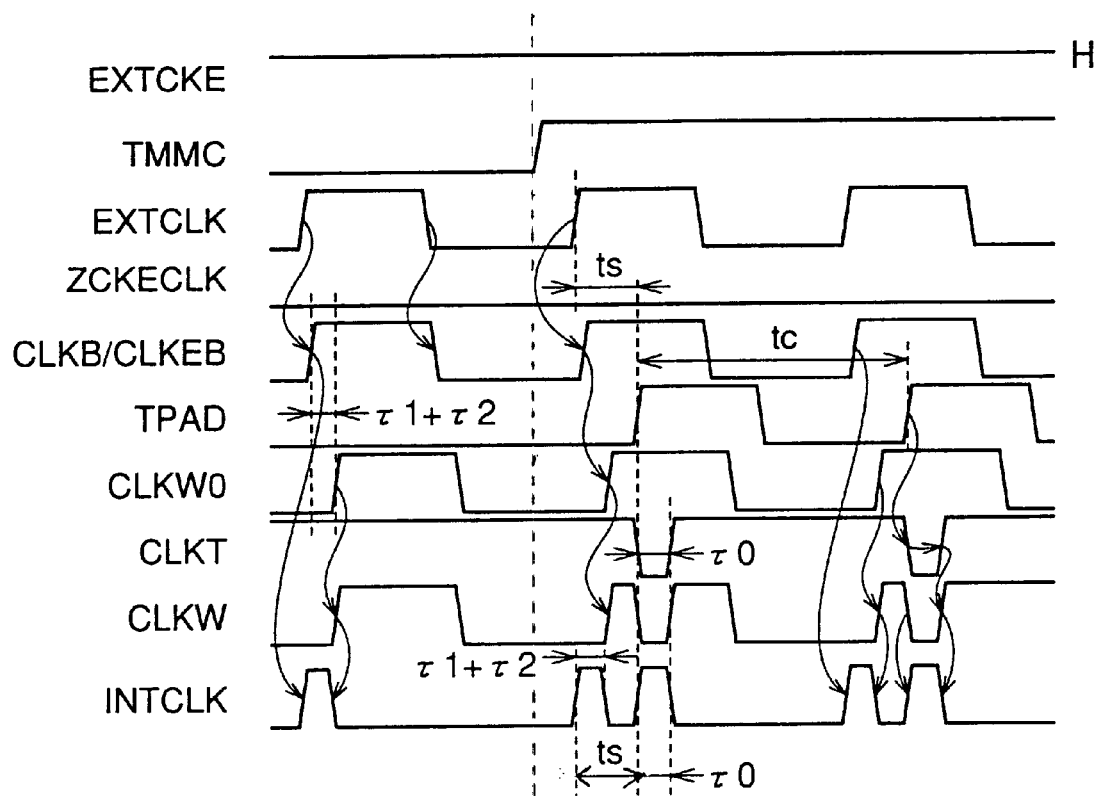
FIG. 27 is a diagram of signal waveforms representing operation of the circuit shown in FIG. 21.

Therefore, in the test operation mode, it is possible to apply a clock signal from a low speed tester through the external clock signal input pad to generate the clock signal CLKB. In this manner, it is possible to generate the high speed internal clock signal INTCLK in the test operation mode, by combining the clock signal EXTCLK from the external circuit tester and the test clock signal CLKT from test clock CLK generating circuit 31 shown in FIG. 25. What is additionally required is only the pad TPAD for test operation, and therefore the number of pads used in the test mode can be reduced. The operation of the clock generating circuitry shown in FIG. 21 will be described in the following with reference to FIG. 27. FIG. 27 is a diagram of signal waveforms in the test operation mode. In the normal operation mode, the operation is the same as that represented by the signal waveforms of FIG. 18.

External clock enable signal EXTCKE is set to the H level, and the internal clock signal is generated in accordance with the externally applied clock signal EXTCLK. When test mode designating signal TMMC is at the L level, the active CLK input buffer and a standby CLK input buffer operate, and generate signals CLKB and CLKEB in accordance with the external clock signal EXTCLK. At this time, as shown in FIG. 23, clock width control signal CLKW rises to the H level with a delay of τ1+τ2 relative to the rise of the signal CLKEB, and falls to the L level in response to the fall of the signal CLKEB. Therefore, internal clock signal INTCLK is at the H level in accordance with the signal CLKB while the signal CLKW is at the L level (see FIG. 17).

When test mode designating signal TMMC is set to the H level, the test mode starts. In this state also, switch circuits SW1 to SW3 all transmit signals at the ground voltage level, the signal ZCKECLK is kept at the L level (when external clock enable signal EXTCKE is at the H level), the active CLK input buffer operates in the similar manner as in the normal operation mode, and generates the signal CLKB in accordance with the external clock signal EXTCLK. Further, the standby CLK input buffer also operates in the similar manner as in the normal operation mode, and generates the signal CLKEB in accordance with the external clock signal EXTCLK. The external clock signal EXTCLK is applied from the tester and has a cycle of tc. To the pad TPAD, the clock signal delayed by the time ts relative to external clock signal EXTCLK is applied. The clock signal applied to pad TPAD is also applied from the tester, and has the same period tc as the external clock signal EXTCLK. In accordance with the signal CLKEB, the signal CLKW0 is generated and, in response to the rise of the signal CLKW0, clock width control signal CLKW rises to the H level. When the clock signal applied to pad TPAD rises to the H level, the test clock signal CLKT from test CLK generating circuit 31 shown in FIG. falls from the H level to the L level. The test clock signal CLKT is held at the L level for the time period T0. When test clock signal CLKT falls to the L level, internal clock width control signal CLKW from INTCLK width determining circuit 22 shown in FIG. 23 falls from the H level to the L level. Therefore, the internal clock signal INTCLK which has been raised to the H level in response to the rise of the signal CLKB attains to the L level in response to the rise of the signal CLKW and thereafter, as the signal CLKB is at the H level, test clock INTCLK again rises to the H level in response to the fall of the signal CLKW. When test clock signal CLKT rises to the H level, internal clock signal INTCLK falls to the L level through clock width control signal CLKW. Therefore, even when external clock signal EXTCLK and the clock signal applied to pad TPAD are applied from a tester operating at a low speed, it is possible to generate a clock signal having the cycle period of ts by setting the skew time ts between the clock signals to an appropriate value. As the internal circuitry operates in accordance with the internal clock signal INTCLK, as in the first embodiment, it is possible to measure timing margin while operating the internal circuitry at high speed.

The timing skew ts can be set by the tester to be a few nanoseconds (ns). However, clock width control signal CLKW must be toggled to generate internal clock signal INTCLK while the signal CLKB is at the H level. Therefore, in this case, the following relations must be satisfied, assuming that the external clock signal EXTCLK has a duty of 50%.

$ts > \tau 1 + \tau 2,$ $tc/2 > ts + \tau 0.$

Assuming that the H level period of internal clock signal INTCLK is about 4 ns and the delay time $\tau 0$ is about 4 ns, there are the following relations.

$ts > \tau 1 + \tau 2 = 4,$ $tc > 2 \cdot ts + 2 \cdot \tau 0 > 16 \text{ ns}$

The H level period of the internal clock signal INTCLK in the test mode is determined by the delay time $\tau 0$, and the delay time $\tau 0$ is approximately equal to 4 ns. Therefore, timing condition of about 10 ns can be measured with sufficient margin.

Figure 28:
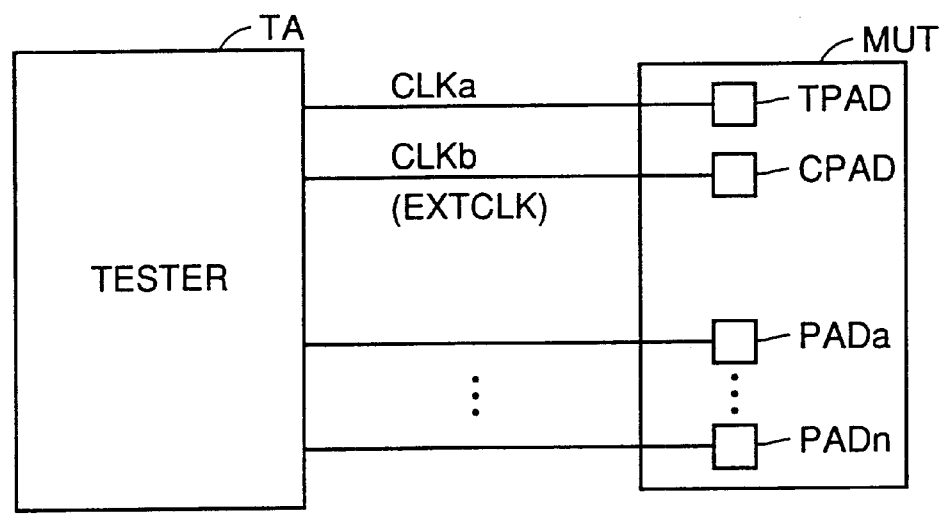
FIG. 28 represents connection between a synchronous semiconductor device and a tester utilizing the clock generating circuitry shown in FIG. 21.

FIG. 28 schematically represents connection between the tester and a semiconductor device having the clock generating circuit shown in FIG. 21. Referring to FIG. 28, clock signals CLKa and CLKb from tester TA are applied to pads TPAD and CPAD of memory under test MUT. Pad CPAD receives external clock signal EXTCLK also in the normal operation mode. For the purpose of test only, pad TPAD is provided. Pads PADa to PADn receive external signals and input/output data in the normal operation mode. Therefore, in the memory under test MUT, the area occupied by the pad provided only for testing can be reduced, and thus the memory under test MUT can be operated at high speed using a low speed tester TA without increasing the occupied chip area.

Connection of switches SW1 to SW3 shown in FIGS. 23, 25 and 26 are determined by mask interconnection in accordance with chip configuration. More specifically, connection paths of switches SW1 to SW3 are determined by mask interconnection to be suitable for the chip in which two prescribed pads PAD1 and PAD 2 are provided or the chip in which the pad TPAD is provided.

Pad Arrangement

Figure 29:
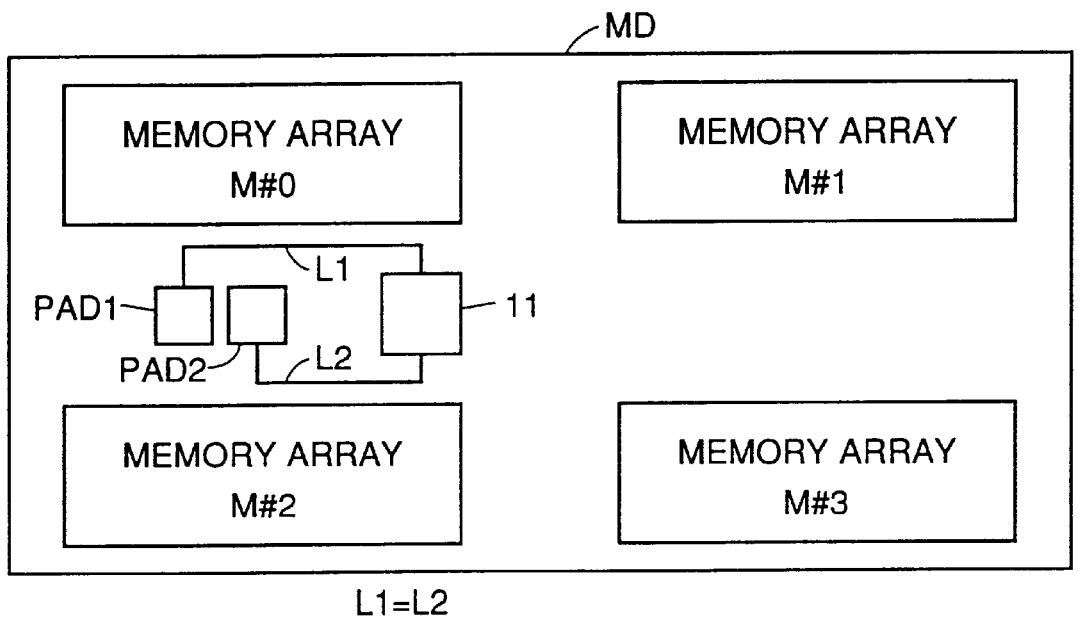
FIGS. 29 and 30 schematically represents arrangement of test clock input pads in the synchronous semiconductor memory device.

FIG. 29 schematically represents arrangement of test clock input pads of the semiconductor device in accordance with the present invention. Referring to FIG. 29, the semiconductor memory device (SDRAM) MD includes four memory arrays M#0 to M#3 arranged on four equally divided regions, respectively. At a central region between memory arrays M#0 and M#2, pads PAD1 and PAD2 are arranged. These pads PAD1 and PAD2 are connected through lines L1 and L2 to test CLK generating circuit 11 arranged substantially at a center region among memory arrays M#0–M#3. The semiconductor memory device MD has a so-called LOC (Lead On Chip) arrangement, and in the central region extending along the longer side of the chip, pads are arranged in alignment. These pads are generally connected to input buffer/output buffer through aluminum interconnection lines. There is not a margin in area to use such aluminum interconnection line for the test signal line in most cases, and a signal line of lower speed such as polysilicon is used for the test signal line. Therefore, when line lengths differ in the test signal transmitting paths, the influence of line delay would be considerable. Therefore, when wafer level test is to be performed, even when an used pad existing on the chip is available, attention must be paid to the arrangement of the unused pad. Here, referring to FIG. 29, the lengths of lines L1 and L2 from pads PAD1 and PAD2 to testing CLK generating circuit 11 respectively are made equal (L1=L2). In response to the rising edge of the clock signals applied through pads PAD1 and PAD2, testing CLK generating circuit 11 generates a one shot pulse signal. Timing skew ts between the clock signals to pads PAD1 and PAD2 is transmitted to test CLK generating circuit 11 through lines L1 and L2 of the same length. Therefore, it is possible to accurately generate the test clock signal CLKT in accordance with the timing skew set by the tester, and hence exact timing measurement is possible, not influenced by the line delay.

Figure 30:
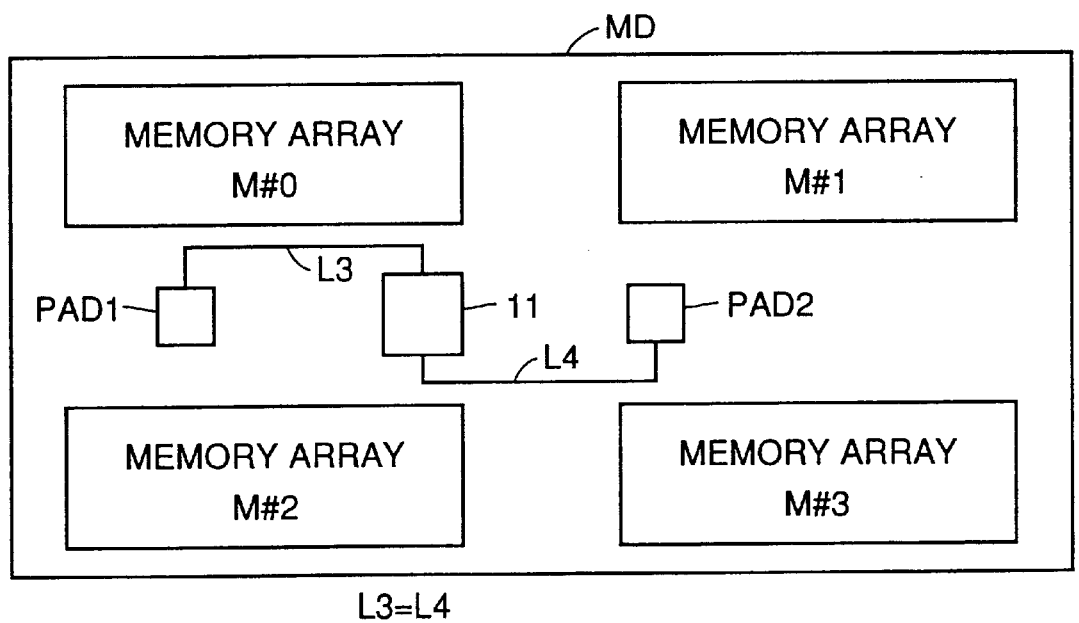

FIG. 30 shows another arrangement of clock input pads. In FIG. 30, pads PAD1 and PAD2 are arranged in symmetry with respect to test CLK generating circuit 11 in the central region of the chip. Pads PAD1 and PAD2 are coupled to testing CLK generating circuit 11 through lines L3 and L4. Lengths of the lines L3 and L4 are made equal to each other. In the pad arrangement shown in FIG. 30 also, the test clock signals applied to pads PAD1 and PAD2 are transmitted to the testing CLK generating circuit 11 with the same line delay. Therefore, it is possible for test CLK generating circuit 11 to generate test clock signal CLKT with the skew time of the test clock signals applied from the tester, without any influence of line delay.

In the pad arrangements shown in FIGS. 29 and 30, positions of pads PAD1 and PAD2 may be exchanged.

Figure 31:
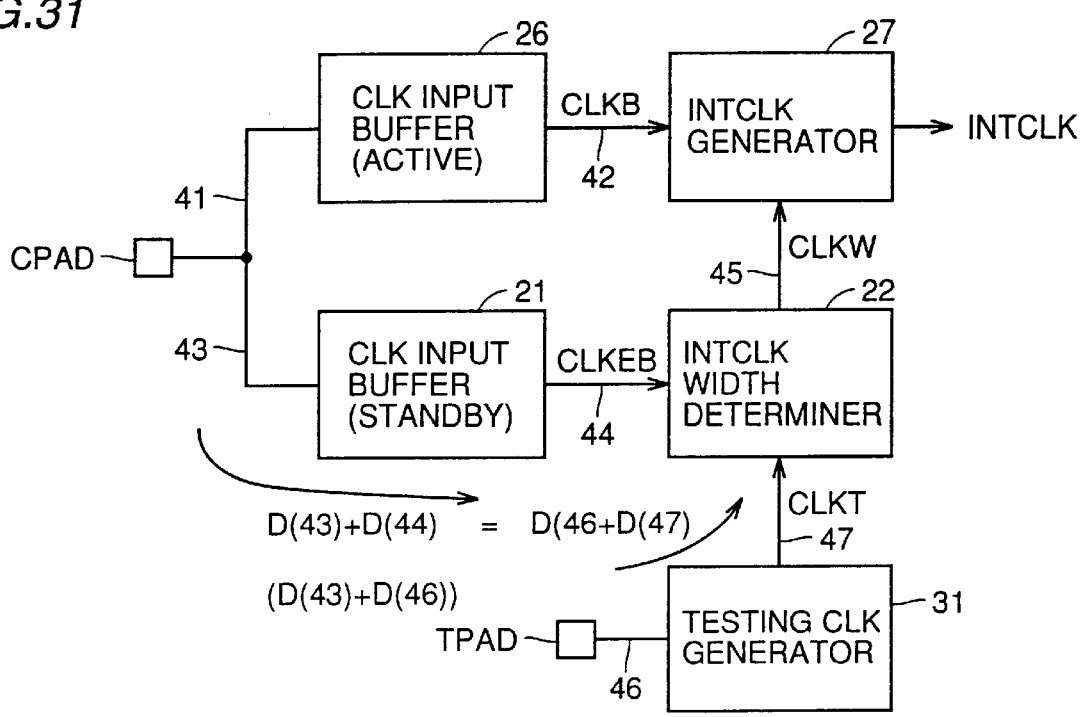
FIG. 31 represents anther arrangement of the test clock input pads.

FIG. 31 shows a further arrangement of the test clock input pads. In the pad arrangement shown in FIG. 31, clock input pad CPAD which is also used in the normal operation mode, and pad TPAD for receiving the test clock signal in the test operation mode are provided. Clock input pad CPAD is coupled to active clock input buffer 26 through a line 41 and coupled to standby clock input buffer 21 through a line 43. Active clock input buffer 28 is further coupled to INTCLK generator 27 through a line 42, and standby clock input buffer 21 is coupled to internal clock width determining circuit 22 through a line 44. In synchronization with the clock signal applied to clock input pad CPAD, signals CLKB and CLKEB are generated from input buffers 26 and 21. The internal clock width determining circuit delays, by a prescribed time period, the signal CLKEB from standby clock input buffer 24 to generate the clock width control signal CLKW and applies the generated signal to INTCLK generator 27 in the normal operation mode.

In accordance with the clock width control signal CLKW, the pulse width of the clock signal INTCLK from INTCLK generator 27 is determined. Generally, to INTCLK generator 27, signals CLKB and CLKW are applied with same signal propagation delay (except delay time in the delay circuit of INTCLK width determining circuit 22). Namely, assuming that the signal propagation delay except the intentional delay time provided by delay circuits in respective circuits is negligible, delay time of lines 41 and 42 are made equal to the signal propagation delay of lines 43, 44 and 45. As the clock signal propagation path operates in the normal operation mode as well, these lines are formed, preferably, of aluminum interconnection lines.

Test CLK generator 31 is coupled to test pad TPAD through a line 46. Test CLK generator 31 transmits test clock signal CLKT through a line 47. Referring to FIG. 23, INTCLK width determining circuit 22 generates clock width control signal CLKW by combining the signal CLKEB and test clock signal CLKT. Therefore, it is necessary to transmit the signals CLKEB and CLKT with the same signal propagation delay. Therefore, the sum of delay times D(43) and D(44) of lines 43 and 44 respectively is set to be equal to the sum of signal propagation delays D(46) and D(47) of lines 46 and 47, respectively. When the circuits are arranged adjacent to each other and signal propagation delays of lines 42, 44, 45 and 47 are negligible, test pad TPAD is arranged such that line signal propagation delay D(46) from test pad TPAD to test CLK generating circuit 31 is made equal to the signal propagation delay D(43) of line 43 between clock input pad CPAD and standby clock input buffer 21. Accordingly, when the clock signals are applied to pads CPAD and TPAD with the timing skew of ts in the test operation mode, it is possible to exactly set the cycle period of internal clock signal INTCLK in accordance with the timing skew set by the tester.

As to the arrangement of pads CPAD and TPAD shown in FIG. 31, arrangement of FIG. 29 or 30 may be used. Further, location of standby clock input buffer 21 and test CLK generator 31 are also determined appropriately in accordance with the location of the clock input buffer which in turn is arranged in the central region of semiconductor memory device MD shown in FIG. 29 or 30. What is necessary is that the line delay time D(43) from clock input pad CPAD to the standby clock input buffer 21 is equal to the signal propagation delay D(46) of line 46 from pad TPAD to test CLK generating circuit 31. When lines 43 and 46 are formed of different materials (for example, when line 46 is formed of polysilicon and line 43 is formed of aluminum), the lengths are determined appropriately, considering line resistances.

As shown in FIGS. 29 to 31, by arranging pads taking into consideration propagation delay of clock signals in each test operation, measurement error derived from variation of line delay can be reduced, and hence more accurate timing measurement is possible.

Clock generating circuitry configuration 3

Figure 32:
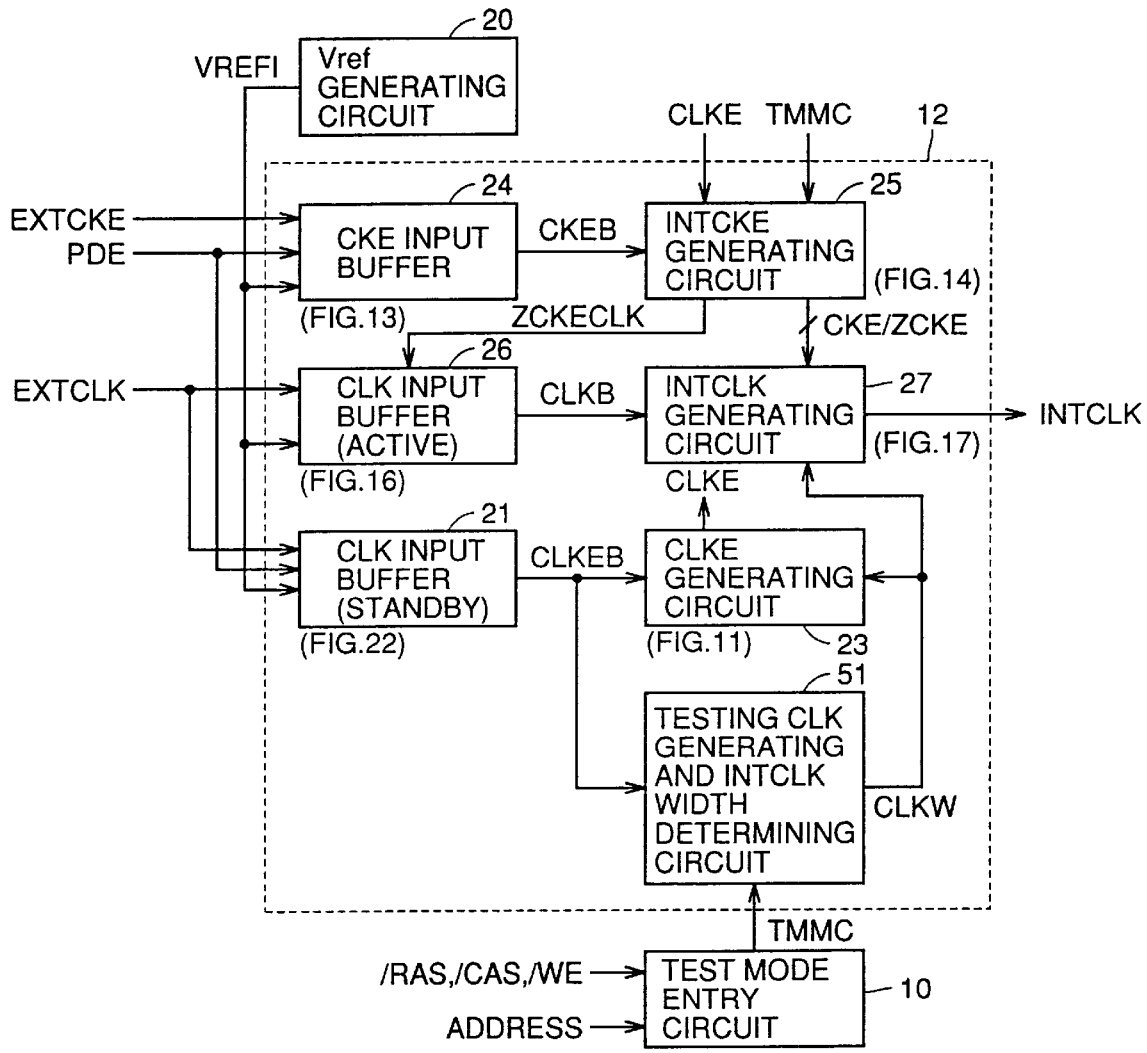
FIG. 32 represents a third configuration of the clock generating circuitry shown in FIG. 2.

FIG. 32 schematically represents a third configuration of the clock generating circuitry of the SDRAM in accordance with the present invention. In the clock generating circuitry shown in FIG. 32, even in the test operation mode, one shot pulse signals are generated in response to both the rising and falling edges of external clock signal EXTCLK, to generate the test clock signals. Therefore, a clock input pad dedicated for testing is not provided, and test clock signals are generated in the test operation using a pad receiving an external clock signal. In clock buffer 12, testing CLK generating/INTCLK width determining circuit 51 is provided which generates, in the test mode, a one shot pulse signal in response to both edges of the signal CLKEB from standby CLK input buffer 21 and generates, in the normal operation mode, the signal CLKW for determining pulse width of the internal clock signal in accordance with the signal CLKEB from standby CLK input buffer 21. Other structures are the same as those shown in FIG. 3 or 21. More specifically, CKE input buffer 24 has the configuration shown in FIG. 13, active CLK input buffer 26 has the configuration shown in FIG. 16, INTCLK generating circuit 27 has the configuration shown in FIG. 17 and CLKE generating circuit 23 has the configuration shown in FIG. 11. Standby CLK input buffer 21 has the configuration shown in FIG. 22, and generates the signal CLKEB in accordance with external clock signal EXTCLK both in the normal operation mode and in the test operation mode.

INTCKE generating circuit 25 has the configuration shown in FIG. 14, and activates/inactivates control signal ZCKECLK for the active CLK input buffer in accordance with the test mode designating signal TMMC.

Figure 33:
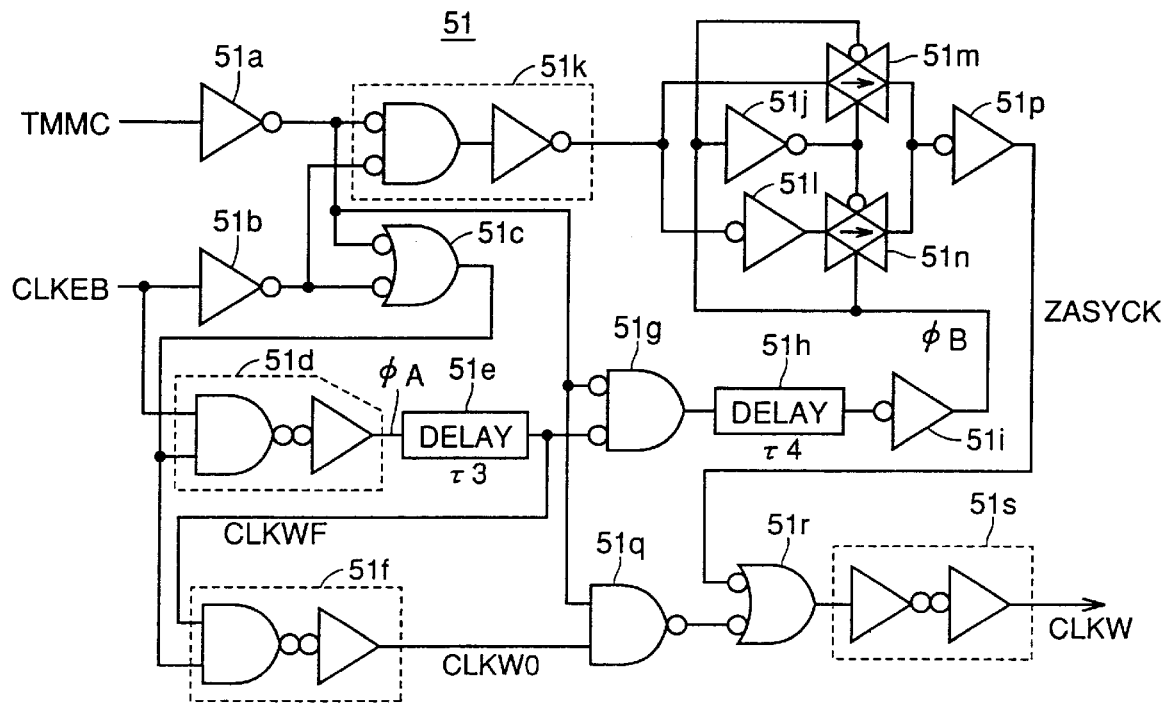
FIG. 33 is a diagram representing a configuration of a test CLK generating/INTCLK width determining circuit shown in FIG. 32.

FIG. 33 represents configuration of test CLK generating/INTCLK width determining circuit 51 shown in FIG. 32. In FIG. 33, test CLK generating/INTCLK width determining circuit 51 includes an inverter 51a receiving test mode designating signal TMMC, an inverter 51b receiving the signal CLKEB from standby CLK input buffer 21, an NAND circuit 51c receiving output signals from inverters 51a and 51b, an AND circuit 51d receiving an output signal from NAND circuit 51c and the signal CLKEB for outputting a signal ΦA, a delay circuit 51e for delaying by a prescribed time period τ3 the signal PA from AND circuit 51d, an AND circuit 51f receiving output signal CLKWF from delay circuit 51e and an output signal from NAND circuit 51c, an NOR circuit 51g receiving an output signal from inverter 51a and an output signal from delay circuit 51e, a delay circuit 51h for delaying by a prescribed time period τ4 an output signal from NOR circuit 51g, an inverter 51i inverting an output signal from delay circuit 51h to output a signal ΦB, an inverter 51j inverting an output signal from inverter 51i, an OR circuit 51k receiving output signals from inverters 51a and 51b, an inverter 51l receiving an output signal from OR circuit 51k, a CMOS transmission gate 51m which is rendered conductive in response to output signals from inverters 51i and 51j for allowing selective passage of an output signal from OR circuit 51k, a CMOS transmission gate 51n which is rendered conductive in complementary manner to CMOS transmission gate 51m in response to output signals from inverters 51i and 51j for allowing selective passage of an output signal from inverter 51l, an inverter 51p inverting a signal transmitted from CMOS transmission gates 51m or 51n for outputting a signal ZASYCK, an NAND circuit 51q receiving an output signal from inverter 51a and the signal CLKW0 from AND circuit 51f, an NAND circuit 51r receiving an output signal from NAND circuit 51q and the signal ZASYCK from inverter 51p, and a drive circuit 51s for buffering an output signal from NAND circuit 51r for generating clock width control signal CLKW.

Each of AND circuits 51d and 51f includes an NAND circuit and an inverter receiving an output signal from the NAND circuit. OR circuit 51k includes an NOR circuit and an inverter receiving an output signal from the NOR circuit. Drive circuit 51s includes two stages of cascaded inverters. Operation of the circuit shown in FIG. 33 will be described with reference to FIGS. 34 and 35.

Figure 34:
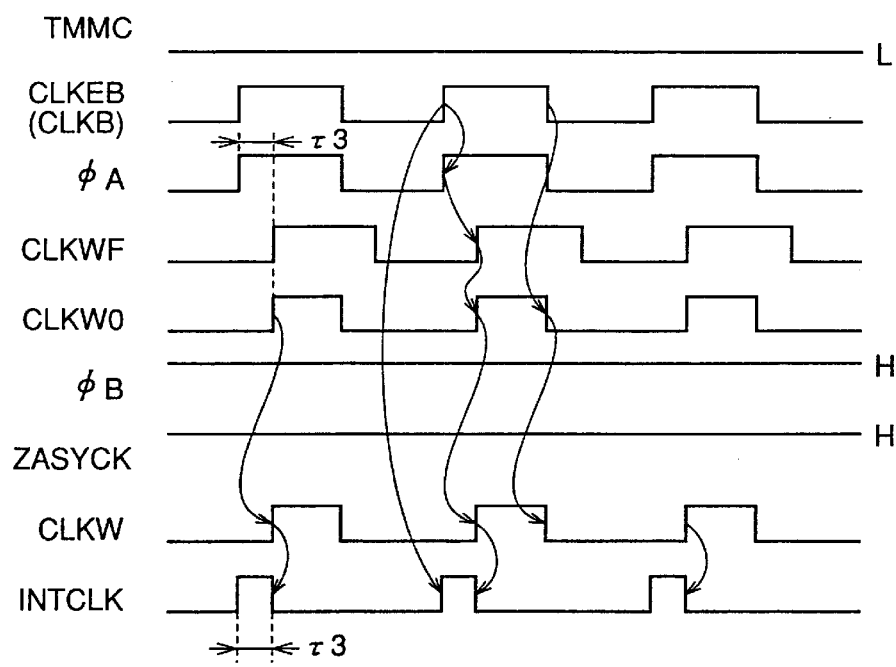
FIGS. 34 and 35 are diagrams of signal waveforms representing operation of the circuit shown in FIG. 33.

First, referring to FIG. 34, the operation in the normal operation mode will be described. In the normal operation mode, test mode designating signal TMMC is held at the L level. In this state, the output signal from inverter 51a is at the H level, and NAND circuit 51c operates as an inverter. Here, it is assumed that gate delay times of inverter 51b and NAND circuit 51c are negligible. A signal which is synchronized with the signal CLKEB applied from standby CLK input buffer shown in FIG. 32 is output from NAND circuit 51c. Accordingly, AND circuit 51d operates as a circuit for buffering the signal CLKEB, and the signal PA changes in synchronization with the signal CLKEB. Delay circuit 51e delays by the time period τ3 and outputs the signal ΦA from AND circuit 51d. AND circuit 51f receives output signal CLKWF from delay circuit 51e and the output signal from NAND circuit 51c. Therefore, the signal CLKW0 from AND circuit 51f rises after the lapse of τ3 from the rise of the signal CLKEB, and falls in synchronization with the fall of the signal CLKEB.

Meanwhile, the output signal from inverter 51a is at the H level, the output signal of NOR circuit 51g is fixed at the L level, and the signal ΦB from inverter 51i is fixed at the H level. In this state, CMOS transmission gate 51n is rendered conductive, while CMOS transmission gate 51m is kept non-conductive. OR circuit 51k outputs a signal at the H level, as the output signal from inverter 51a is at the H level. Accordingly, by inverter 51l, CMOS transmission gate 51n and inverter 51p, the signal ZASYCK is fixed at the H level. In response, NAND circuit 51r operates as an inverter. NAND circuit 51q operates as an inverter by receiving the signal at the H level from inverter 51a. Therefore, clock width control signal CLKW is synchronized with the signal CLKW0 output from AND circuit 51f Clock width control signal CLKW is applied to INTCLK generating circuit shown in FIG. 17. Therefore, internal clock signal INTCLK rises in response to the rise of clock signal CLKB and, after the lapse of time τ3, it falls to the L level in response to the rise of clock width control signal CLKW. Therefore, in the normal operation mode, in synchronization with the external clock signal EXTCLK (CLKB), internal clock signal INTCLK having a constant time width (τ3) is generated.

Figure 35:
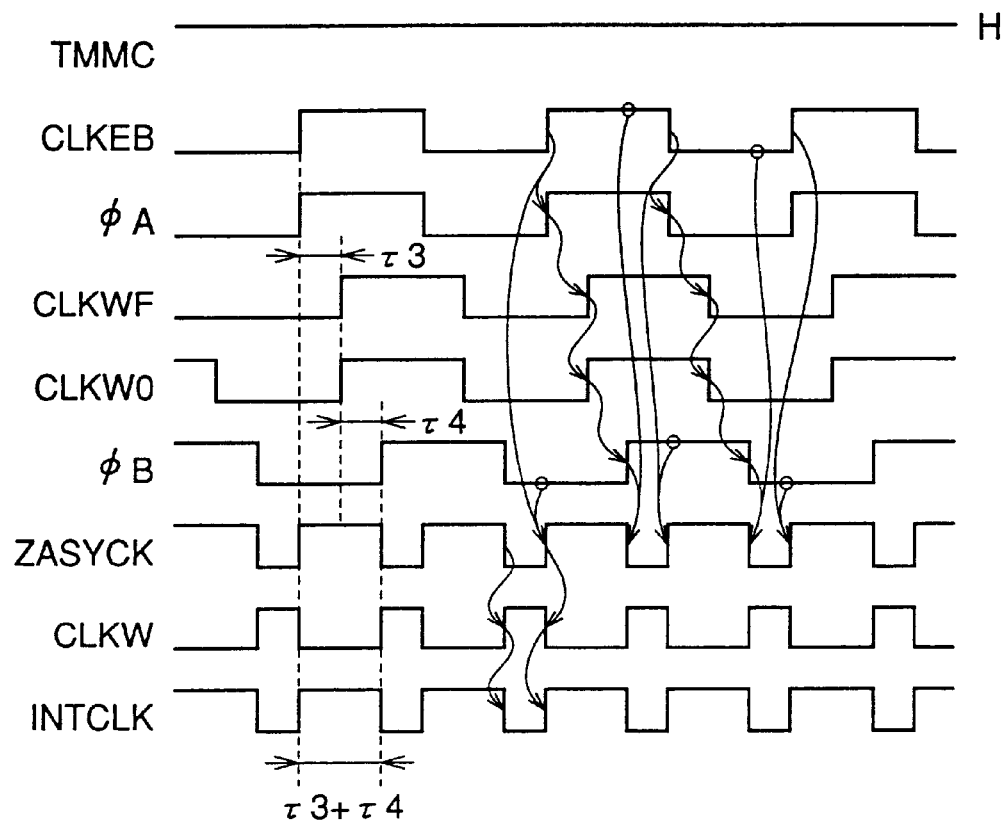

Next, referring to FIG. 35, operation in the test operation mode will be described. In the test operation mode, the signal TMMC is set to the H level. The INTCKE generating circuit 25 shown in FIG. 32 has the configuration shown in FIG. 14 and, when test mode designating signal TMMC is activated to the H level, sets the signal ZCKECLK to the H level. Consequently, active CLK input buffer 26 shown in FIG. 32 is driven to the inactive state, and the signal CLKB is fixed to the H level. Therefore, INTCLK generating circuit 27 shown in FIG. 17 generates the internal clock signal INTCLK in accordance with the signal CLKW.

Standby CLK input buffer 21 generates internal signal CLKEB in accordance with the clock signal EXTCLK applied from external low speed tester. As the test mode designating signal TMMC is at the H level, the output signal from NAND circuit 51c attains to the H level, and AND circuits 51d and 51f operate as buffer circuits, respectively. Accordingly, the signal ΦA from AND circuit 51d changes in synchronization with the signal CLKEB, and a signal obtained by delaying the signal ΦA by the time τ3 is output from delay circuit 51e. The signal CLKW0 from AND circuit 51f is synchronized with the signal CLKWF, as the output signal from NAND circuit 51c is at the H level, whereas NAND circuit 51g outputs a signal at the H level regardless of the state of the signal CLKW0, as the output signal of inverter 51a is at the L level.

NOR circuit 51g operates as an inverter in accordance with the L level signal from inverter 51a, inverts the output signal CLKWF of delay circuit 51e and applies the inverted signal to delay circuit 51h. Delay circuit 51h delays the output signal from NOR circuit 51e by the time τ4. Therefore, the signal ΦB is the signal CLKW0 delayed by the time period τ4. Namely, the signal ΦB has the delay time of τ3+τ4 with respect to the external clock signal (signal CLKEB). In accordance with the signal ΦB, CMOS transmission gates 51m and 51n are rendered conductive in complementary manner. When the output signal of inverter 51a is at the L level, OR circuit 51k operates as a buffer circuit, and generates an output signal in accordance with the signal CLKEB applied through inverter 51b. When the signal ΦB is at the H level, CMOS transmission gate 51n is rendered conductive, and the signal ZASYCK makes a transition in accordance with the output signal from OR circuit 51k. When the signal ΦB is at the L level, CMOS transmission gate 51m is rendered conductive, and the signal ZASYCK is thus the inverted signal of the output signal from OR circuit 51k. Therefore, when the signal ΦB is at the H level, the signal ZASYCK is an inverted signal of signal CLKEB and when the signal ΦB is at the L level, the signal ZASYCK is a signal in phase with the signal CLKEB. Therefore, the signal ZASYCK is kept at the H level for the period τ3+τ4 from the rise of the signal CLKEB, and kept at the H level for the time period τ3+τ4 from the fall of the signal CLKEB. The signal ΦB is. the signal CLKEB delayed by τ3+τ4, and the point of transition of the signal ΦB exists in each of the H and L level periods of the signal CLKEB. Therefore, when the signal CLKEB rises to the H level, by the signal ΦB, the signal ZASYCK is generated in accordance with the signal CLKEB, and when the signal CLKEB falls by the H level signal 4B, the signal ZASYCK is generated in accordance with an inverted signal of CLKEB. Therefore, the signal ZASYCK is kept at the H level for the period τ3+τ4 in response to each of the rise and fall of clock signal EXTCLK (signal CLKEB).

NOR circuit 51r operates as an inverter in accordance with the H level signal from AND circuit 51q, and drive circuit 51s generates the clock width control signal CLKW in accordance with the output signal from NAND circuit 51r. Therefore, the signal CLKW is an inverted signal of the signal ZASYCK. The clock width control signal CLKW is applied to INTCLK generating circuit 27 and internal clock signal INTCLK is generated. In the test operation mode, clock signal CLKB is fixed at the H level, and therefore internal clock signal INTCLK is the inverted signal of clock width control signal CLKW. Therefore, the H level period of internal clock signal INTCLK is the time period τ3+τ4.

As the testing CLK generating/INTCLK width determining circuit 51 shown in FIG. 33 is used, in accordance with one external clock signal EXTCLK, an internal clock signal INTCLK having twice the frequency can be generated.

Further, as the external clock signal EXTCLK is applied in the normal operation mode as well, it is possible to apply the test clock signal from a low speed tester in the test operation mode through a clock signal input pad, without the necessity of providing a pad dedicated for testing.

Figure 36:
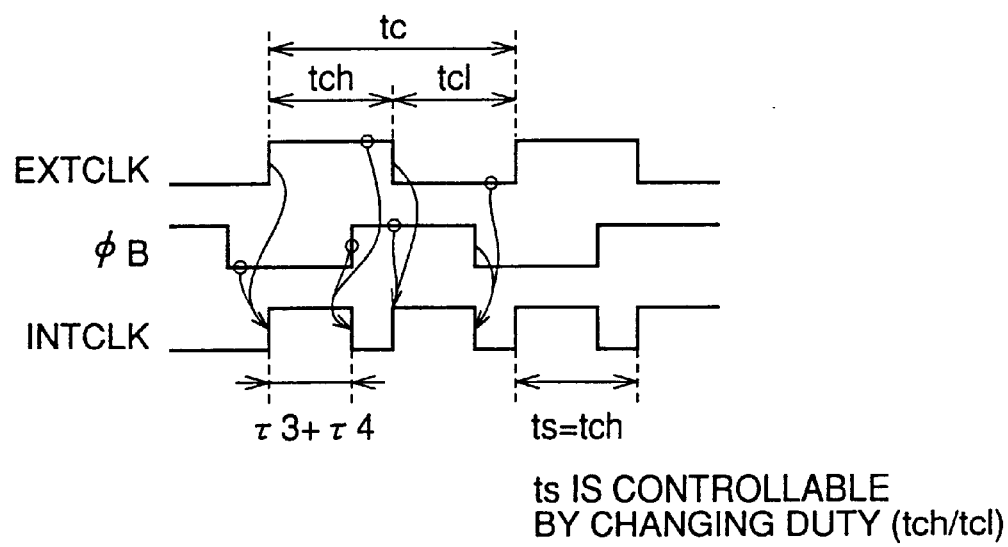
FIG. 36 represents relation between external and internal clock signals at the clock generating circuitry shown in FIG. 32.

FIG. 36 shows relation between pulse widths of external clock signal EXTCLK and internal clock signal INTCLK. External clock signal EXTCLK has the H level period of tch and L level period of tc1. The cycle period tc of external clock signal EXTCLK is given as tch+ch1. Because of the clock signal switching by signal ΦB, internal clock signal INTCLK comes to have the H level period of τ3+τ4. By the delay time of signal ΦB, the H level period of internal clock signal INTCLK is determined. In order to cause transition of internal clock signal INTCLK at both the rising and falling edges of external clock signal EXTCLK, the relation, tch>τ3+τ4, must be satisfied. The delay time τ3 determines the H level period of internal clock signal INTCLK in the normal operation mode. Therefore, by setting delay time τ4 to an appropriate value, it is possible to generate internal clock signal INTCLK having the H level period comparable to that in the normal operation mode. The cycle period of the internal clock signal INTCLK in the test operation mode is determined by the H level period tch of external clock signal EXTCLK. Therefore, even when a low speed tester is used and the cycle period tc of clock signal EXTCLK is constant, the cycle period ts of internal clock signal INTCLK can be made shorter by shortening the H level period tch. In other words, even when the clock cycle period tc=tch+tc1 of the tester cannot be much decreased, it is possible to shorten the H level period of the external clock signal EXTCLK and to shorten the cycle period of internal clock signal INTCLK, by decreasing duty=tch/tc1 of the clock signal. Therefore, by changing the duty under the condition of tch>τ3+τ4, a high speed internal clock signal can be generated using even a low speed clock signal. Further, even when external clock signal EXTCLK has a constant period tc, it is possible to change the period ts of the internal clock signal by changing the duty. Therefore, timing measurement under various conditions is possible simply by adjusting duty, without the necessity of adjusting clock skew.

Figure 37:
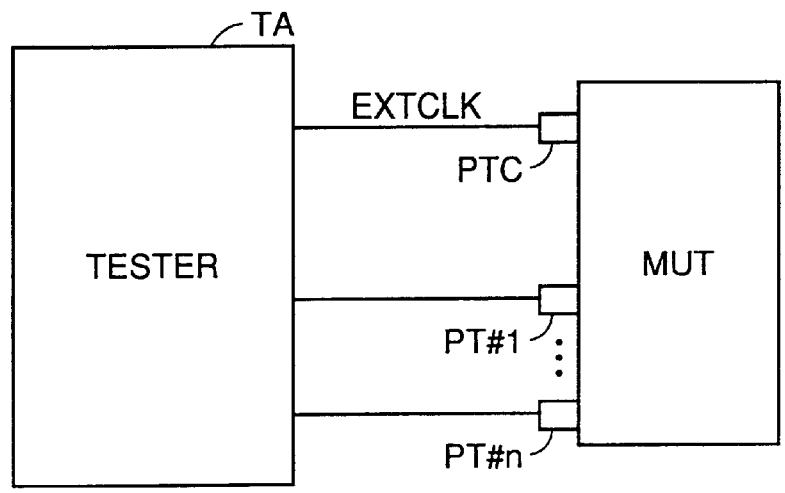
FIG. 37 represents connection between a memory device and a tester utilizing the clock generating circuitry shown in FIG. 32.

FIG. 37 schematically represents connection between the tester and the memory under test. Referring to FIG. 37, tester TA supplies test clock signal EXTCLK to a clock input terminal PTC of memory under test MUT. Further, prescribed signals are applied to remaining pin terminals PT#1 to PT#n of memory under test MUT from the tester TA. As shown in FIG. 37, it is possible for tester TA to supply a test clock signal using only the clock input pin PTC of the memory under test MUT. Signals having prescribed functions are applied respectively to remaining pin terminals PT#1 to PT#n. When two phase clock signals are to be applied to the memory device MUT, it is necessary to utilize a specific pin terminal not used in the test mode, after packaging. In this case, if a specific function is allocated to that pin terminal (for example, data mask designation DQM), test for the signal to the specific pin terminal cannot be performed in the test mode, and therefore contents of the test is limited. However, as the configuration shown in FIG. 37 is adapted to generate a clock signal of a multiplied frequency internally by utilizing the clock signal EXTCLK applied to a clock input pin terminal PTC without providing a pad dedicated for testing, it becomes possible to perform prescribed tests for the signals applied to pin terminals PT#1 to PT#n. Therefore, it is possible, even after sealing in a package, to perform timing check of various signals using a low speed tester TA.

In the circuit configuration shown in FIG. 33, in the test operation mode, the signal CLKW0 makes a transition in accordance with the clock signal CLKEB (EXTCLK). A configuration may be used in which an inverted signal of the test mode designating signal TMMC is applied to AND circuit 51$f$ so that the signal CLKW0 is fixed at the L level in the test operation mode.

The circuit configuration show in FIG. 33 has a function of controlling clock width of the internal clock signal in the normal operation mode and of generating an internal clock signal in the test mode. Alternatively, a configuration may be used in which one shot pulse signals are generated in response to rising and falling edges of clock signal CLKEB, and the test clock signal CLKT is generated in accordance with logical sum of the one shot pulse signals. In that case, overall circuit configuration corresponds to the configuration shown in FIG. 3 or 21. In place of the clock signals from pads PAD1 and PAD2 or the clock signal from pad TPAD, external clock signal EXTCLK is applied to the testing CLK generating circuit where one shot pulse signals are generated in synchronization with the rising and falling edges of the external clock signal CLK.

Other applications

In the foregoing, an SDRAM has been described as an example of a synchronous semiconductor device. The device may be a semiconductor device which inputs/outputs signals in synchronization with a clock signal, for example, a processor, a DSP (Digital Signal Processor), a digital integrated circuit or, as a memory, a synchronous SRAM. Further, as a memory, a flash memory may be used, and the present invention is applicable to any configuration in which data access takes place in synchronization with the clock signal.

Figure 38:
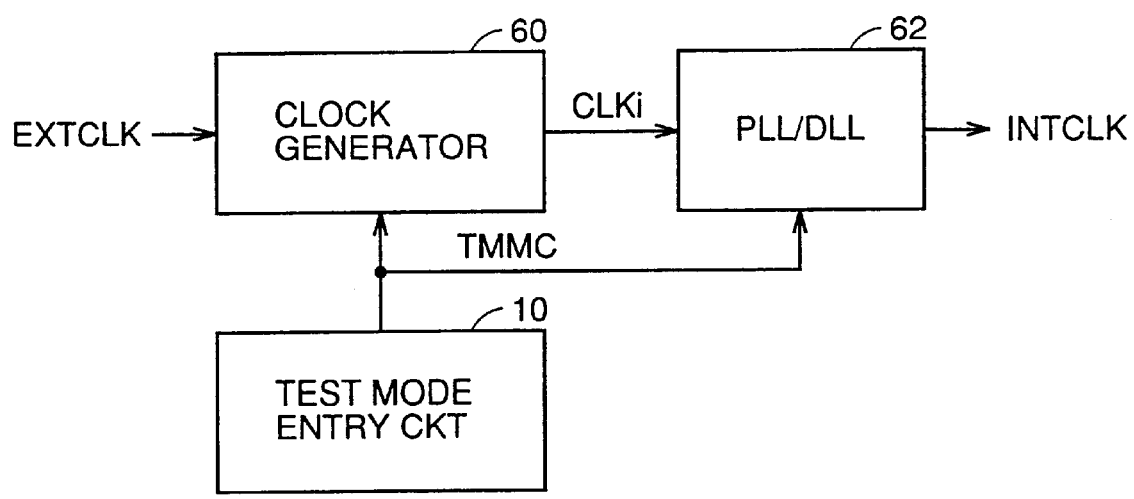
FIG. 38 schematically represents configuration of a main portion of another synchronous semiconductor device in accordance with the present invention.

FIG. 38 schematically represents a configuration of a main portion of the synchronous semiconductor device to which the present invention is applied. Referring to FIG. 38, a configuration of the portion generating the internal clock signal is represented schematically. In FIG. 38, the synchronous semiconductor memory device includes a clock generator 60 for generating, in the normal operation mode, an internal clock signal CLK1 in accordance with an external clock signal EXTCLK, a phase synchronizing circuit (PLL/DLL) 62 for generating and applying to internal circuitry (input/output buffers) the clock signal INTCLK synchronized in phase with clock signal CLK1 from clock generator 60, and a test mode entry circuit 10 for activating test mode designating signal TMMC in the test operation mode for controlling operations of clock generator 60 and phase synchronizing circuit 62.

Test mode entry circuit 10 is the same as the circuit shown in FIG. 3 and such described above. Clock generator 60 generates, in the test operation mode, the test clock signal in accordance with the external clock signal EXTCLK or the test clock signal applied through a specific pad, and generates internal clock signal CLK1 in accordance with the thus generated test clock signal. Any of configurations 1 to 3 of the clock generating circuitry described above may be used for the clock generator 60.

Phase synchronizing circuit (PLL/DLL) 62 stops phase synchronizing operation when test mode designating signal TMMC is activated, and generates internal clock signal INTCLK in synchronization with the clock signal CLKi from clock generator 60. As to the configuration of phase synchronizing circuit (PLL/DLL), any configuration in which either the clock signal CLK1 from clock generator 60 or the signal from phase synchronizing circuit (PLL/DLL) is simply selected in accordance with the test mode designating signal TMMC to generate internal clock signal INTCLK, may be used.

In the synchronous semiconductor device having such a phase synchronizing circuit (PLL/DLL) 62, internal clock signal INTCLK which is synchronized in phase with external clock signal EXTCLK is generated, in order to prevent malfunction caused by clock skew derived from line delay and the like. Internal clock signal INTCLK is generally applied to the input/output buffer circuits. When the phase synchronizing circuit (PLL/DLL) is adapted to be synchronized with the high speed clock signal and pull in range thereof is narrow, it is difficult to generate internal clock signal INTCLK which is synchronized in phase with the low speed clock signal. In that case, simply by activating test mode activating signal TMMC, internal clock signal INTCLK is generated in accordance with the clock signal CLK1 from clock generator 60. In this manner, even in the synchronous semiconductor device having phase synchronizing circuit (PLL/DLL) 62, it is possible to generate a high speed internal clock using a low speed clock signal.

As described above, according to the present invention, using at least one edge transition of a low speed clock signal as a trigger, pulses are generated and utilized as internal clock signals. Therefore, it becomes possible to generate high speed internal clock signals utilizing a low speed clock signal, and therefore a synchronous semiconductor device operating at high speed can be tested by a low speed tester.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor device, comprising:
   at least one clock input pad;
   clock generating circuitry including a pulse generating circuit responsive to at least one of rising edge and falling edge of a clock signal applied to said at least one clock input pad; in a specific operation mode for performing a predetermined operation, for generating a plurality of pulses in one cycle of said clock signal, and an internal clock signal generating circuit for generating an internal clock signal in accordance with transitions of the generated pulses, each generated pulse having a pulse width independent of a pulse width of said clock signal; and
   internal circuitry operating in response to said internal clock signal, for performing a prescribed operation.

2. The synchronous semiconductor device according to claim 1, wherein said clock signal comprises an external clock signal, and first and second clock signals, and
   said at least one clock input pad includes
   a normal clock input pad for receiving the external clock signal applied externally in a normal operation mode other than said specific operation mode,
   a first specific pad provided separately from said normal clock input pad for receiving the first clock signal applied externally in said specific operation mode, and
   a second specific pad provided separately from said normal clock input pad and said first specific pad, for receiving the second clock signal applied externally in said specific operation mode, said first and second clock signals being different in phase from each other; and
   said pulse generating circuit generates a one shot pulse signal in response to each transition of said first and second clock signals applied respectively to the first and second specific pads, and said internal clock signal generating circuit is responsive to the pulse signal from said pulse generating circuit for generating said internal clock signal.

3. The synchronous semiconductor device according to claim 2, wherein said internal clock signal generating circuit includes a circuit which is activated when a signal designating said specific operation mode is inactive, for generating said internal clock signal in synchronization with the clock signal applied to said normal clock input pad, and enabled when the signal designating said specific operation mode is active, for generating said internal clock signal in accordance with the pulses from said pulse generating circuit.

4. The synchronous semiconductor device according to claim 2, wherein
   said internal clock signal generating circuit includes
   a first clock input buffer activated when a signal designating said specific operation mode is inactive, for generating a first internal signal synchronized with the clock signal applied to said normal clock input pad, and inactivated when the signal designating said specific operation mode is active, for outputting said first internal signal at a constant level,
   a clock width determining circuit receiving the first internal signal from said first clock input buffer, delaying said first internal signal by a prescribed time period for generating a pulse signal with a prescribed delay time and outputting the generated signal as a second internal signal when the signal designating said specific operation mode is inactive, and when the signal designating said specific operation mode is active, for generating and outputting said second internal signal in accordance with the pulse from said pulse generating circuit,
   a second clock input buffer for generating, when the signal designating said specific operation mode is inactive, a third internal signal in accordance with the clock signal applied to said normal clock input pad, and inactivated when the signal designating said specific operation mode is active, for generating said third internal signal at a fixed level, and
   a clock output circuit for generating and outputting said internal clock signal in accordance with the second and third internal signals.

5. The synchronous semiconductor device according to claim 4, wherein said clock output circuit includes a gate circuit for taking a logical product of an inverted signal of said second internal signal and said third internal signal.

6. The synchronous semiconductor device according to claim 4, wherein
   said internal clock generating circuit further includes
   a transfer signal generating circuit for generating a transfer signal in accordance with the first and second internal signals,
   a mask circuit for taking and transferring a clock mask signal applied externally in synchronization with said transfer signal, for generating an internal mask signal, and
   a clock control circuit for generating and applying to said second clock input buffer, a clock buffer activating signal controlling activation and inactivation of said second clock input buffer in accordance with said internal mask signal when the signal designating said specific operation mode is inactive, and holding and outputting said clock buffer activating signal at an inactive state when the signal designating said specific operation mode is active.

7. The synchronous semiconductor device according to claim 2, wherein a line length between said first specific pad and said pulse generating circuit is substantially equal to a line length between said second specific pad and said pulse generating circuit.

8. The synchronous semiconductor device according to claim 1, wherein
said at least one clock input pad includes
a normal clock input pad receiving a first clock signal applied externally in a normal operation mode and a specific operation mode, and
a specific pad provided separately from said clock input pad for receiving a second clock signal in said specific operation mode; and
said pulse generating circuit generates the pulses in accordance with transitions of the first and second clock signals in said specific operation mode,
the first and second clock signals being different in phase from each other.

9. The synchronous semiconductor device according to claim 8, wherein
said pulse generating circuit includes
a circuit for generating a one shot pulse signal in response to the second clock signal applied to said specific pad,
a circuit for delaying the first clock signal applied to said normal clock input pad to generate a clock width control signal, and
a circuit receiving said clock width control signal and said one shot pulse signal and including a gate circuit for inactivating said clock width control signal when said one shot pules signal is active, for generating a clock width determining signal in accordance with said clock width control signal, and
said internal clock generating circuit includes a clock output circuit receiving said first clock signal together with said clock width determining signal, for generating said internal clock signal in accordance with said first clock signal when said clock width determining signal is inactive, and for generating said internal clock signal at a level of a reset state in response to activation of said clock width determining signal.

10. The synchronous semiconductor device according to claim 9, wherein the clock output circuit includes a gate for generating said internal clock signal through a logical product of said clock width determining signal and a first internal signal generated in synchronization with said first clock signal.

11. The synchronous semiconductor device according to claim 9, wherein a line delay between said specific pad and said pulse generating circuit is made substantially equal to a signal propagation delay between said normal clock input pad and the circuit to generate said clock width control signal.

12. The synchronous semiconductor device according to claim 1, wherein
said at least one clock input pad includes one specific pad, and
said internal clock signal generating circuit generates said internal clock signal in accordance with a one shot pulse signal generated by said pulse generating circuit in response to each of rising and falling edges of the clock signal applied -to said specific pad.

13. The synchronous semiconductor device according to claim 12, wherein
said pulse clock generating circuit includes
a circuit for generating, by delaying the clock signal applied to said specific pad, a delayed clock signal and a clock width control signal,
a delay circuit responsive to activation of a signal designating said specific operation mode for delaying said delayed clock signal,
a clock adjusting circuit for generating, when the signal designating said specific operation mode is active, complementary clock signals corresponding to the clock signal applied to said specific pad and to an inverted signal of said clock signal, respectively,
clock selecting circuits rendered conductive complementarily in accordance with an output signal from said delay circuit, for selectively passing complementary clock signals from said clock adjusting circuit, and
a gate circuit for generating, when the signal designating said specific operation mode is active, a clock width determining signal in accordance with an output signal from said clock selecting circuits and said clock width control signal, and
said internal clock signal generating circuit includes a clock output circuit for outputting said internal clock signal in accordance with the clock signal applied to said specific pad and with said clock width determining signal.

14. The synchronous semiconductor device according to claim 12, wherein said specific pad is coupled to a clock input terminal receiving an external clock signal after packed.

15. The synchronous semiconductor device according to claim 1, wherein said at least one clock input pad includes first and second specific pads receiving clock signals different in phase from each other, with signal propagation delay times from said first and second specific pads to said clock generating circuitry made substantially equal to each other.

16. The synchronous semiconductor device according to claim 1, wherein said clock generating circuitry has a circuit configuration different from a circuit configuration performing a phase adjustment by feeding back said internal clock signal through a loop.

* * * * *